(12) United States Patent
Lee et al.

(10) Patent No.: US 11,462,518 B2
(45) Date of Patent: Oct. 4, 2022

(54) DISPLAY DEVICE

(71) Applicant: Samsung Display Co., LTD., Yongin-si (KR)

(72) Inventors: Sung Jin Lee, Yongin-si (KR); Jin Yeong Kim, Yongin-si (KR); Jin Taek Kim, Yongin-si (KR); Mi Jin Park, Yongin-si (KR); Jin Woo Lee, Yongin-si (KR); Kwang Taek Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 49 days.

(21) Appl. No.: 16/988,163

(22) Filed: Aug. 7, 2020

(65) Prior Publication Data
US 2021/0134768 A1     May 6, 2021

(30) Foreign Application Priority Data
Nov. 1, 2019   (KR) .......................... 10-2019-0138734

(51) Int. Cl.
| | |
|---|---|
| H01L 25/075 | (2006.01) |
| H01L 25/16 | (2006.01) |
| H01L 33/38 | (2010.01) |
| H01L 33/44 | (2010.01) |
| H01L 33/24 | (2010.01) |

(52) U.S. Cl.
CPC ........ *H01L 25/0753* (2013.01); *H01L 25/167* (2013.01); *H01L 33/38* (2013.01); *H01L 33/24* (2013.01); *H01L 33/44* (2013.01)

(58) Field of Classification Search
CPC ... H01L 25/0753; H01L 25/167; H01L 33/38; H01L 33/24; H01L 33/44; H01L 33/62; H01L 27/3246; H01L 27/3248; H01L 27/3262; H01L 27/3279; H01L 27/156; H01L 21/76838; H01L 33/0045
See application file for complete search history.

(56) References Cited

U.S. PATENT DOCUMENTS

| | | | |
|---|---|---|---|
| 8,872,214 B2 | 10/2014 | Negishi et al. | |
| 9,112,112 B2 | 8/2015 | Do et al. | |
| 9,773,761 B2 | 9/2017 | Do | |
| 10,249,603 B2 | 4/2019 | Cho et al. | |
| 10,361,344 B2* | 7/2019 | Fukasawa | F21S 2/00 |
| 10,367,123 B2 | 7/2019 | Im et al. | |
| 2011/0089850 A1 | 4/2011 | Shibata et al. | |
| 2017/0301314 A1 | 10/2017 | Kim et al. | |
| 2018/0373366 A1* | 12/2018 | Li | G06F 3/0443 |

(Continued)

FOREIGN PATENT DOCUMENTS

| | | |
|---|---|---|
| KR | 10-2012-0122159 | 11/2012 |
| KR | 10-1490758 | 2/2015 |

(Continued)

*Primary Examiner* — Victor A Mandala
(74) *Attorney, Agent, or Firm* — Kile Park Reed & Houtteman PLLC

(57) ABSTRACT

A display device includes a substrate including a display area and a non-display area, and pixels disposed in the display area. The pixels each include first electrodes, second electrodes spaced apart from the first electrodes, and light emitting elements disposed between the first electrodes and the second electrodes. The first electrodes each include a closed loop of a polygonal shape in some sections.

20 Claims, 17 Drawing Sheets

(56) References Cited

U.S. PATENT DOCUMENTS

2019/0019930 A1\*  1/2019  Do ........................ H01L 33/62
2020/0335720 A1\* 10/2020  Kishimoto ............ H05B 33/22
2021/0288033 A1\*  9/2021  Lim ................... H01L 27/1214

FOREIGN PATENT DOCUMENTS

| KR | 10-2017-0119794 | 10/2017 |
| KR | 10-2018-0055021 | 5/2018 |
| KR | 10-2019-0006430 | 1/2019 |
| KR | 10-1987196 | 6/2019 |

\* cited by examiner

DISPLAY DEVICE

CROSS-REFERENCE TO RELATED APPLICATION(S)

This application claims priority to and benefits of Korean Patent Application No. 10-2019-0138734 under 35 U.S.C. § 119, filed in the Korean Intellectual Property Office on Nov. 1, 2019, the entire contents of which are incorporated herein by reference.

BACKGROUND

1. Technical Field

One or more embodiments of the invention relate to a display device.

2. Discussion of the Related Art

In recent years, a technology has developed involving manufacturing a micro light emitting element using a material of an inorganic crystal structure having high reliability, and manufacturing a light emitting device using the light emitting element. For example, a light source of the light emitting device using the micro light emitting elements may be configured with a size as small as about a nano scale to about a micro scale. Such a light emitting device may be used in various electronic devices such as a display device or a lighting device.

The light emitting elements may be prepared in a form dispersed in a solution and supplied to a light emission area of a pixel through an inkjet printing method, a slit coating method, or the like. In case that a voltage may be supplied to first and second electrodes of the pixel, an electric field may be formed between the first and second electrodes, and the light emitting elements may be self-aligned between the first and second electrodes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments of the invention may be directed to a display device capable of improving a behavior of light emitting elements between first and second electrodes while the light emitting elements may be self-aligned.

A display device according to an embodiment of the invention for resolving the above-described aspect may include a substrate including a display area and a non-display area, and pixels disposed in the display area.

The pixels may each include first electrodes, second electrodes spaced apart from the first electrodes, and light emitting elements disposed between the first electrodes and the second electrodes, and the first electrodes may each include a closed loop of a polygonal shape in some sections.

The closed loop of the polygonal shape may be any of a rhombus, a hexagon, and an octagon.

The first electrodes may each include a first section, a second section connected to an end of the first section and having the closed loop of the polygonal shape, a third section discontinuously extending from the first section, and a fourth section having an end connected to a region of the first section and another end connected to an end of the third section.

The second electrodes may each include a fifth section, a sixth section connected to an end of the fifth section and extending along an outer shape of the second section, a seventh section continuously extending from the fifth section via the sixth section, and an eighth section spaced apart from each of the second section and the fourth section.

The light emitting elements may be disposed between the second section and the sixth section, between the second section and the eighth section, and between the fourth section and the eighth section.

The light emitting elements may be disposed radially with respect to the second section.

The second electrodes may each include a ninth section spaced apart from the second section, the ninth section having an island shape disposed inside the closed loop of the second section.

The light emitting elements may be disposed radially with respect to the second section between the second section and the ninth section.

The light emitting elements may each include a first semiconductor layer, a second semiconductor layer, and an active layer disposed between the first semiconductor layer and the second semiconductor layer. The first semiconductor layer may include an n-type semiconductor layer, and the second semiconductor layer may include a p-type semiconductor layer.

The pixels may be arranged in a pentile structure.

A display device according to another embodiment of the invention for resolving the above-described aspect may include a substrate, a pixel circuit portion disposed on the substrate, and a display element portion disposed on the pixel circuit portion.

The display element portion may include a pixel, the pixel includes first electrodes, second electrodes spaced apart from the first electrodes, and light emitting elements disposed between the first electrodes and the second electrodes. The first electrodes may each include a closed loop of a polygonal shape in some sections.

The pixel circuit portion may include a driving transistor, a switching transistor, a capacitor, and a driving line.

The first electrodes may each include a first section, a second section connected to an end of the first section and having the closed loop of the polygonal shape, a third section discontinuously extending from the first section, and a fourth section having an end connected to a region of the first section and another end connected to an end of the third section.

The second electrodes may each include a fifth section, a sixth section connected to an end of the fifth section and extending along an outer shape of the second section, a seventh section continuously extending from the fifth section via the sixth section, and an eighth section spaced apart from each of the second section and the fourth section.

The light emitting elements may be disposed between the second section and the sixth section, between the second section and the eighth section, and between the fourth section and the eighth section.

The light emitting elements may be disposed radially with respect to the second section of the polygonal shape.

The pixel circuit portion may include a first bridge pattern, the end of the first section may be connected to an electrode of the driving transistor through a first contact hole, the seventh section may be connected to the first bridge pattern through a second contact hole, and the first bridge pattern may be connected to the driving voltage line through a third contact hole.

The second electrodes may further include a ninth section spaced apart from the second section, the ninth section having an island shape disposed inside the closed loop of the polygonal shape formed in the second section.

The light emitting elements may be disposed radially with respect to the second section of the polygonal shape between the second section and the ninth section.

The pixel circuit portion may include a second bridge pattern, the seventh section may be connected to the second bridge pattern through the second contact hole, the second bridge pattern may be connected to the driving voltage line through the third contact hole, and the ninth section may be connected to the second bridge pattern through a fourth contact hole.

The display device according to the embodiments of the invention may include the first and second electrodes having a structure such that a behavior of the light emitting elements may be improved between the first and second electrodes while the light emitting elements may be self-aligned.

BRIEF DESCRIPTION OF THE DRAWINGS

The above and other aspects and features of the disclosure will become more apparent by describing in further detail embodiments with reference to the accompanying drawings, in which.

DETAILED DESCRIPTION OF THE EMBODIMENTS

Figure 1A:
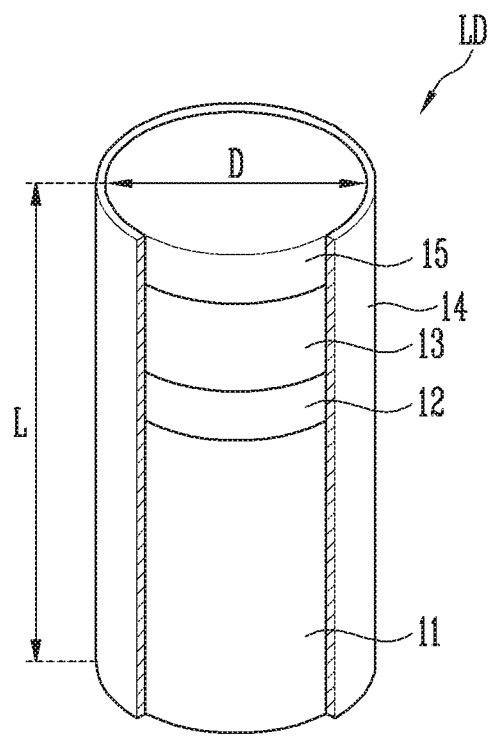
FIG. 1A is a perspective view schematically illustrating a light emitting element according to an embodiment of the invention.

The same reference numerals refer to the same components. In the drawings, thicknesses, ratios, and dimensions of the components may be exaggerated for effective description of technical contents.

As used herein, the singular forms "a," "an," and "the" are intended to include the plural forms as well, unless the context clearly indicates otherwise. "And/or" includes all of one or more combinations that may be defined by associated configurations. For example, "A and/or B" may be understood to mean "A, B, or A and B." The terms "and" and "or" may be used in the conjunctive or disjunctive sense and may be understood to be equivalent to "and/or."

Terms of "first", "second", and the like may be used to describe various components, but the components should not be limited by the terms. The terms are used only for the purpose of distinguishing one component from another component. For example, without departing from the scope of the invention, a first component may be referred to as a second component, and similarly, a second component may also be referred to as a first component.

The phrase "at least one of" is intended to include the meaning of "at least one selected from the group of" for the purpose of its meaning and interpretation. For example, "at least one of A and B" may be understood to mean "A, B, or A and B."

Terms such as "under", "below", "on", and "above" are used to describe an association of configurations shown in the drawings. The terms are described based on a direction indicated in the drawings as relative concepts. Similarly, Terms such as "overlap" and "cover" may include layer, stack, face, extend over, extend under, or any other suitable term as would be appreciated and understood by those of ordinary skill in the art, and may refer to a partial or full overlap or cover, as would be appreciated and understood by those of ordinary skill in the art.

It will also be understood that when a layer is referred to as being "on" or the like with respect to another layer or substrate, it can be directly on the other layer or substrate, or intervening layers may also be present. In contrast, when an element is referred to as being "directly on" another element, there may be no intervening elements present.

It should be understood that terms such as "include", "have", or the like are used to specify that there is a feature, a number, a step, an operation, a component, a part, or a combination thereof described in the specification, but does not exclude a possibility of the presence or addition of one or more other features, numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
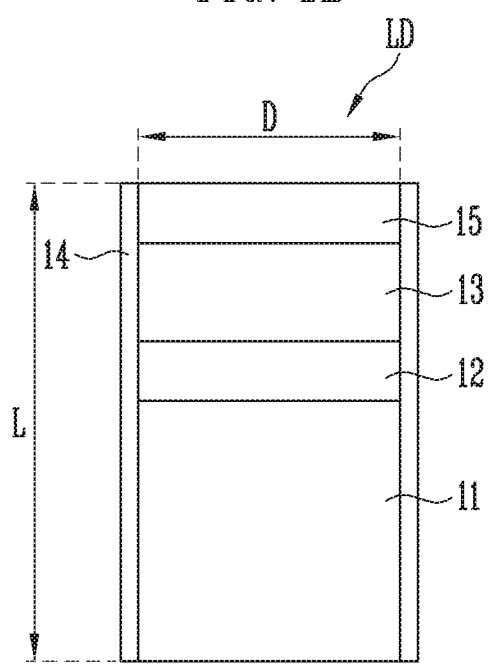
FIG. 1B is a schematic cross-sectional view of the light emitting element of FIG. 1A.
Figure 2A:
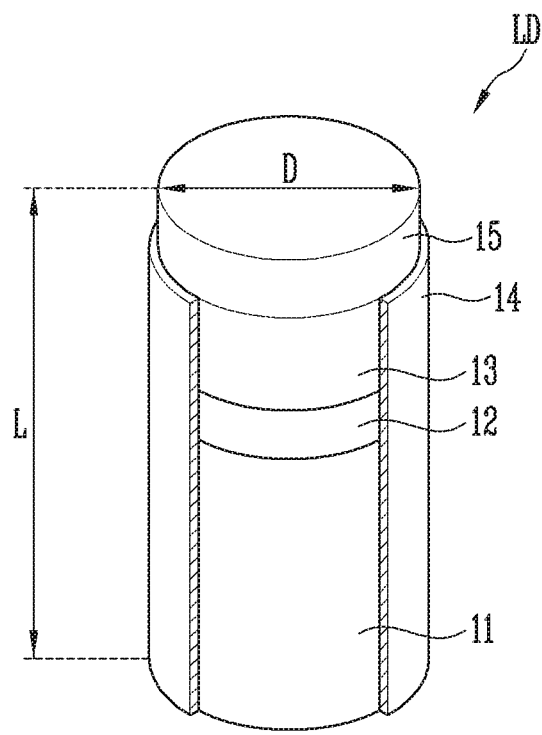
FIG. 2A is a perspective view schematically illustrating a light emitting element according to another embodiment of the invention.
Figure 2B:
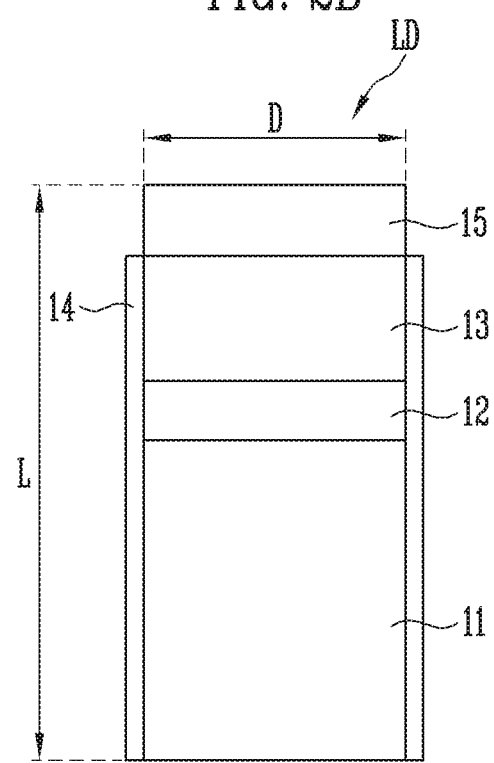
FIG. 2B is a schematic cross-sectional view of the light emitting element of FIG. 2A.
Figure 3A:
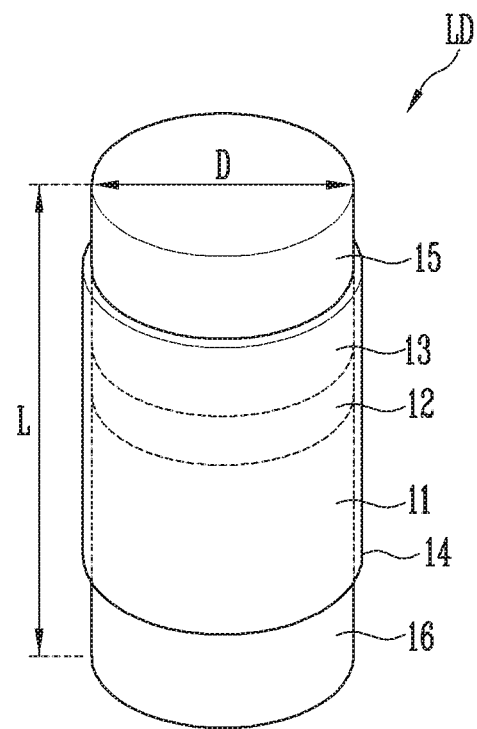
FIG. 3A is a perspective view schematically illustrating a light emitting element according to another embodiment of the invention.
Figure 3B:
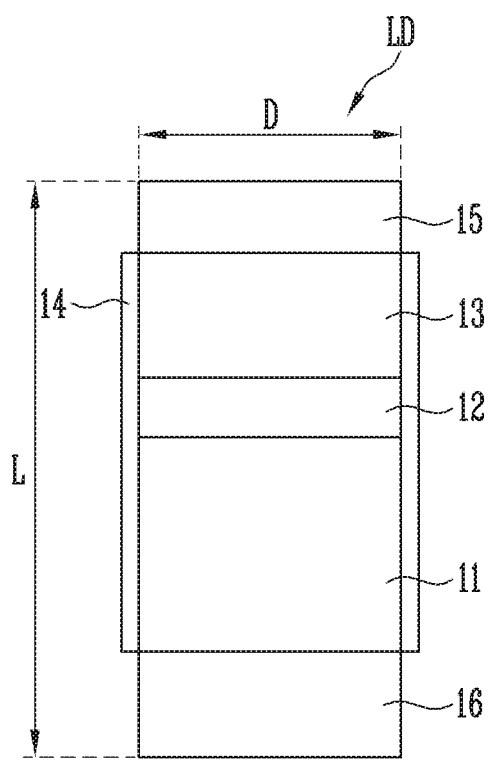
FIG. 3B is a schematic cross-sectional view of the light emitting element of FIG. 3A.
Figure 4A:
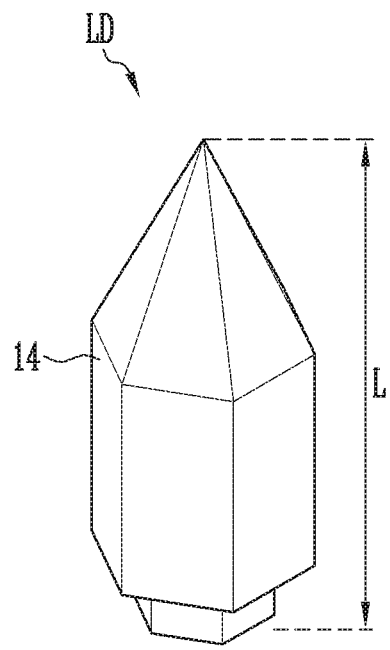
FIG. 4A is a perspective view schematically illustrating a light emitting element according to still another embodiment of the invention.

FIG. 1A is a perspective view schematically illustrating a light emitting element according to an embodiment of the invention. FIG. 1B is a schematic cross-sectional view of the light emitting element of FIG. 1A. FIG. 2A is a perspective view schematically illustrating a light emitting element according to another embodiment of the invention. FIG. 2B is a schematic cross-sectional view of the light emitting element of FIG. 2A. FIG. 3A is a perspective view schematically illustrating a light emitting element according to another embodiment of the invention. FIG. 3B is a schematic cross-sectional view of the light emitting element of FIG. 3A. FIG. 4A is a perspective view schematically illustrating a light emitting element according to still another embodiment of the invention, and FIG. 4B is a schematic cross-sectional view of the light emitting element of FIG. 4A.

Figure 4B:
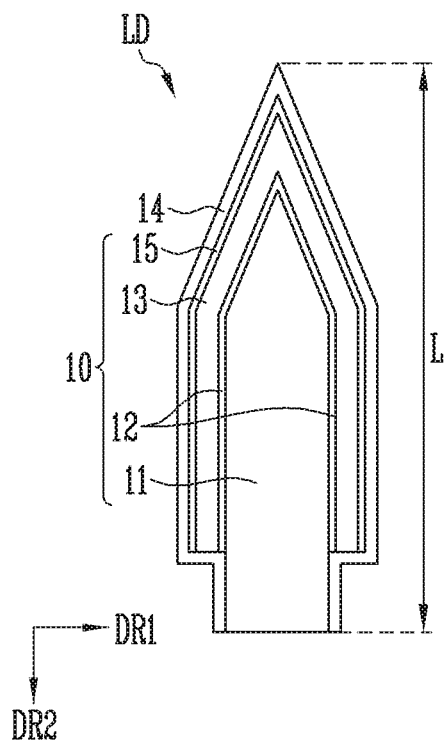
FIG. 4B is a schematic cross-sectional view of the light emitting element of FIG. 4A.

For convenience, after describing FIGS. 1A, 1B, 2A, 2B, 3A, and 3B showing a light emitting element manufactured by an etching method, FIGS. 4A and 4B showing a light emitting element manufactured by a growth method are described. In an embodiment of the invention, a type and/or a shape of the light emitting element are/is not limited to the embodiments shown in FIGS. 1A, 1B, 2A, 2B, 3A, 3B, 4A, and 4B.

First, referring to FIGS. 1A, 1B, 2A, 2B, 3A, and 3B, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack in which the first semiconductor layer 11, the active layer 12, and the second semiconductor layer 13 may be stacked (e.g., sequentially stacked) on each other.

According to an embodiment of the invention, the light emitting element LD may be disposed in a shape extending in a direction. In case that an extension direction of the light emitting element LD is referred to as a longitudinal direction, the light emitting element LD may have a side end portion and another side end portion along the extension direction. Any semiconductor layer of the first and second semiconductor layers 11 and 13 may be disposed at the side end portion of the light emitting element LD, and another of the first and second semiconductor layers 11 and 13 may be disposed at another side end portion of the light emitting element LD.

The light emitting element LD may be disposed in various shapes. For example, the light emitting element LD may have a rod-like shape or a bar-like shape that may be long in the longitudinal direction (for example, an aspect ratio may be greater than 1). In an embodiment of the invention, a length L of the light emitting element LD in the longitudinal direction may be greater than a diameter D (or a width of a cross section) of the light emitting element LD. The light emitting element LD may include, for example, a light emitting diode manufactured to be extremely small to have the diameter D and/or the length L of about a micro scale or about a nano scale. In an embodiment of the invention, a size of the light emitting element LD may be changed to accord with a requirement condition (or a design condition) of a lighting device or a self-luminous display device.

For example, the first semiconductor layer 11 may include at least one n-type semiconductor layer. For example, the first semiconductor layer 11 may include any semiconductor material among InAlGaN, GaN, AlGaN, InGaN, AlN, and InN, or a combination thereof, and may include an n-type semiconductor layer doped with a first conductive dopant such as Si, Ge, or Sn, or a combination thereof. However, the material of the first semiconductor layer 11 is not limited thereto, and various materials may configure the first semiconductor layer 11.

The active layer 12 may be disposed on the first semiconductor layer 11 and may be formed in a single or multiple quantum well structure. A position of the active layer 12 may be variously changed according to the type of the light emitting element LD. The active layer 12 may emit light of a wavelength of about 400 nm to about 900 nm, and may use a double hetero structure. In an embodiment of the invention, a cladding layer (not shown) doped with a conductive dopant may be formed on and/or under the active layer 12. For example, the cladding layer may be formed of an AlGaN layer or an InAlGaN layer, or a combination thereof. According to an embodiment, a material such as AlGaN or AlInGaN, or a combination thereof may be used to form the active layer 12. Various materials may form the active layer 12.

In case that an electric field of a voltage or more than a voltage may be applied to both end portions of the light emitting element LD, the light emitting element LD emits light while an electron-hole pair may be combined in the active layer 12. By controlling light emission of the light emitting element LD by using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, or a combination thereof, and may include a p-type semiconductor layer doped with a second conductive dopant such as Mg. However, the material of the second semiconductor layer 13 is not limited thereto, and various materials may configure the second semiconductor layer 13.

In an embodiment of the invention, the first semiconductor layer 11 and the second semiconductor layer 13 may have widths (or thicknesses) different from each other in the direction of the length L of the light emitting element LD. For example, the first semiconductor layer 11 may have a width relatively wider (or a thickness thicker) than that of the second semiconductor layer 13 along the direction of the length L of the light emitting element LD. Therefore, the active layer 12 of the light emitting element LD may be positioned to be closer to an upper surface of the second semiconductor layer 13 than to a lower surface of the first semiconductor layer 11 as shown in FIGS. 1A to 3B.

According to an embodiment of the invention, the light emitting element LD may further include an additional electrode 15 disposed on the second semiconductor layer 13 in addition to the above-described first semiconductor layer 11, active layer 12, and second semiconductor layer 13. According to an embodiment, as shown in FIGS. 3A and 3B, the light emitting element LD may further include another additional electrode 16 disposed at an end of the first semiconductor layer 11.

The additional electrodes 15 and 16 may be ohmic contact electrodes, but are not limited thereto, and may be schottky contact electrodes according to an embodiment. The additional electrodes 15 and 16 may include a metal or metal oxide, or a combination thereof. For example, chromium (Cr), titanium (Ti), aluminum (Al), gold (Au), nickel (Ni), ITO, oxides or alloys thereof, and the like may be used alone or in combination, but the invention is not limited thereto.

The materials included in each of the additional electrodes 15 and 16 may be the same as or different from each other. The additional electrodes 15 and 16 may be substantially transparent or translucent. Therefore, the light generated by the light emitting element LD may pass through the additional electrodes 15 and 16 and may be emitted to the outside of the light emitting element LD. According to an embodiment, in case that the light generated by the light emitting element LD does not pass through the additional electrodes 15 and 16 and may be emitted to the outside of the light emitting element LD through a region except for the both end portions of the light emitting element LD, the additional electrodes 15 and 16 may include an opaque metal.

In an embodiment of the invention, the light emitting element LD may further include an insulation film 14. However, according to an embodiment, the insulation film 14 may be omitted and may be disposed so as to cover only a part of the first semiconductor layer 11, the active layer 12, and the second semiconductor layer 13.

The insulation film 14 may prevent an electrical short circuit that may occur in case that the active layer 12 may be in contact with a conductive material other than the first semiconductor layer 11 and the second semiconductor layer 13. By forming the insulation film 14, lifetime and efficiency of the light emitting element LD may be improved by minimizing a surface defect of the light emitting element LD. In case that light emitting elements LD are closely disposed, the insulation film 14 may prevent an unwanted short circuit that may occur between the light emitting elements LD. In case that the active layer 12 may prevent an occurrence of a short circuit with an external conductive material, presence or absence of the insulation film 14 is not limited.

As shown in FIGS. 1A and 1B, the insulation film 14 may be disposed in a form surrounding (e.g., entirely surrounding) an outer circumferential surface of the light emitting stack including the first semiconductor layer 11, the active layer 12, the second semiconductor layer 13, and the additional electrode 15. For convenience of description, a portion of the insulation film 14 is removed in FIG. 1A, and the first semiconductor layer 11, the active layer 12, the second semiconductor layer 13, and the additional electrode 15 included in the actual light emitting element LD may be surrounded by the insulation film 14.

In the above-described embodiment, the insulation film 14 may surround (e.g., entirely surround) the outer circumferential surface of each of the first semiconductor layer 11, the active layer 12, the second semiconductor layer 13, and the additional electrode 15, but the invention is not limited thereto.

According to an embodiment, as shown in FIGS. 2A and 2B, the insulation film 14 may surround the outer circumferential surface of each of the first semiconductor layer 11, the active layer 12, and the second semiconductor layer 13 and may not surround (e.g., entirely surround) the outer circumferential surface of the additional electrode 15 disposed on the second semiconductor layer 13, or may surround only a portion of the outer circumferential surface of the additional electrode 15 and may not surround the remaining outer circumferential surface of the additional electrode 15. However, the insulation film 14 may expose at least both end portions of the light emitting element LD. For example, the insulation film 14 may expose an end portion of the first semiconductor layer 11 together with the additional electrode 15 disposed at an end side of the second semiconductor layer 13. According to an embodiment, as shown in FIGS. 3A and 3B, in case that the additional electrodes 15 and 16 are disposed at the end portions of the light emitting element LD, the insulation film 14 may expose at least a region of each of the additional electrodes 15 and 16. As another example, the insulation film 14 may not be provided.

According to an embodiment of the invention, the insulation film 14 may include a transparent insulating material. For example, the insulation film 14 may include one or more insulating materials selected from a group consisting of SiO2, Si3N4, Al2O3, and TiO2, but is not limited thereto, and various materials having insulating properties may be used.

In case that the insulation film 14 may be disposed on the light emitting element LD, a short circuit between the active layer 12 and a first electrode and/or a second electrode (not shown) may be prevented. By forming the insulation film 14, the lifetime and efficiency of the light emitting element LD may be improved by minimizing surface defects of the light emitting element LD. In case that light emitting elements LD are closely disposed, the insulation film 14 may prevent the unwanted short circuit that may occur between the light emitting elements LD.

The above-described light emitting element LD may be used as a light emitting source of various display devices. The light emitting element LD may be manufactured by a surface treatment process. For example, in case that light emitting elements LD are mixed in a fluid solution (or a solvent) and supplied to each light emission area (for example, a light emission area of each pixel or a light emission area of each sub pixel), the surface treatment may be performed on each of the light emitting elements LD so that the light emitting elements LD may be uniformly sprayed without being uniformly aggregated in the solution.

The light emitting device including the light emitting element LD described above may be used in various types of devices that require a light source, including a display device. For example, in case that light emitting elements LD are disposed in a light emission area of each pixel of a display panel, the light emitting elements LD may be used as a light source of each pixel. However, application of the light emitting element LD is not limited to the above-described example. For example, the light emitting element LD may be used in other types of devices that require a light source, such as a lighting device.

A light emitting element LD manufactured by a growth method is described with reference to FIGS. 4A and 4B.

In describing the light emitting element LD manufactured by the growth method, description will be given on points differing from the above-described embodiments, and parts that are not specifically described in the light emitting element LD manufactured by the growth method may follow the above-described embodiments, and the same numerals are given to similar and/or the same components as those of the above-described embodiments.

Referring to FIGS. 4A and 4B, the light emitting element LD according to an embodiment of the invention may include the first semiconductor layer 11, the second semiconductor layer 13, and the active layer 12 interposed between the first and second semiconductor layers 11 and 13. According to an embodiment, the light emitting element LD may include a light emission pattern 10 of a core-shell structure including the first semiconductor layer 11 positioned in a center, the active layer 12 surrounding at least a side of the first semiconductor layer 11, the second semiconductor layer 13 surrounding at least a side of the active layer 12, and the additional electrode 15 surrounding at least a side of the second semiconductor layer 13.

The light emitting element LD may be disposed in a polygonal horn shape extending in a direction. For example, the light emitting element LD may be disposed in a hexagonal horn shape. In case that the extension direction of the light emitting element LD is referred to as the direction of the length L, the light emitting element LD may have an end portion (or a lower end portion) and another end portion (or an upper end portion) along the direction of the length L. A portion of a semiconductor layer of the first and second semiconductor layers 11 and 13 may be exposed at the end portion (or the lower end portion) of the light emitting element LD, and a portion of the other semiconductor layer of the first and second semiconductor layers 11 and 13 may be exposed at the other end portion (the upper end portion) of the light emitting element LD. For example, a portion of the first semiconductor layer 11 may be exposed at the end portion (or the lower end portion) of the light emitting element LD, and the second semiconductor layer 13 may be exposed at the other end portion (or the upper end portion) of the light emitting element LD. According to an embodiment, in case that the light emitting element LD includes the additional electrode 15, a portion of the additional electrode 15 surrounding at least a side of the second semiconductor layer 13 may be exposed at the other end portion (or the upper end portion) of the light emitting element LD.

In an embodiment of the invention, the first semiconductor layer 11 may be positioned at a core, for example, a center of the light emitting element LD. The light emitting element LD may be disposed in a shape corresponding to a shape of the first semiconductor layer 11. For example, in case that the first semiconductor layer 11 has a hexagonal horn shape, the light emitting element LD and the light emission pattern 10 may also have a hexagonal horn shape.

The active layer 12 may be disposed and/or formed in a shape surrounding the outer circumferential surface of the first semiconductor layer 11 in the direction of the length L of the light emitting element LD. Specifically, the active layer 12 may be disposed and/or formed in a shape surrounding the remaining region except for the other end portion disposed at the lower side of the both end portions of the first semiconductor layer 11 in the direction of the length L of the light emitting element LD.

The second semiconductor layer 13 may be disposed and/or formed in a shape surrounding the active layer 12 in the direction of the length L of the light emitting element LD, and may include a semiconductor layer of a type different from that of the first semiconductor layer 11. For example, the second semiconductor layer 13 may include at least one p-type semiconductor layer.

In an embodiment of the invention, the light emitting element LD may include the additional electrode 15 surrounding at least a side of the second semiconductor layer 13. The additional electrode 15 may be an ohmic contact electrode or a schottky contact electrode electrically connected to the second semiconductor layer 13, but is not limited thereto.

As described above, the light emitting element LD may be configured in the hexagonal horn shape having a shape in which the end portions may be protruded, and may be implemented as the light emission pattern 10 of a core-shell structure including the first semiconductor layer 11 disposed in the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the end portion (or the lower end portion) of the light emitting element LD having the hexagonal horn shape, and the additional electrode 15 may be disposed at another end portion (or the upper end portion) of the light emitting element LD.

According to an embodiment, the light emitting element LD may further include the insulation film 14 disposed on an outer circumferential surface of the light emission pattern 10 of the core-shell structure. The insulation film 14 may include a transparent insulating material.

Figure 5:
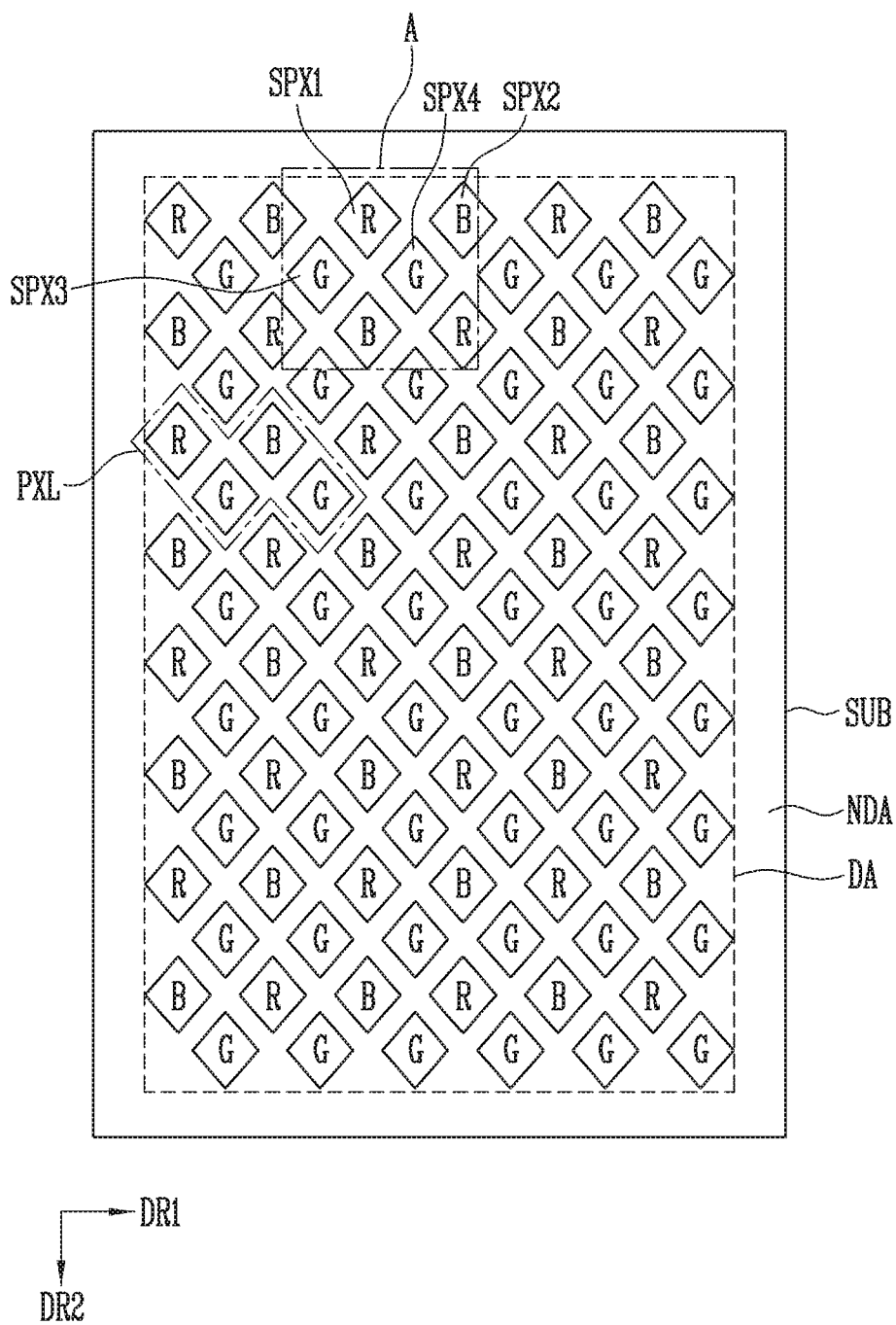
FIG. 5 is a schematic plan view illustrating a display device according to an embodiment of the invention, in particular, a display device using any light emitting element as a light emitting source among the light emitting elements shown in FIGS. 1A, 1B, 2A, 2B, 3A, 3B, 4A, and 4B.

FIG. 5 is a schematic plan view illustrating a display device according to an embodiment of the invention, in particular, a display device using any light emitting element among the light emitting elements shown in FIGS. 1A, 1B, 2A, 2B, 3A, 3B, 4A, and 4B as a light emitting source.

In FIG. 5, for convenience, a structure of the display device is briefly shown based on a display area where an image may be displayed. However, according to an embodiment, at least one driver (for example, a scan driver, a data driver, and the like) and/or signal lines, which are not shown, may be further disposed in the display device.

Referring to FIGS. 1A, 1B, 2A, 2B, 3A, 3B, 4A, 4B, and 5, the display device according to an embodiment of the invention may include a substrate SUB, pixels PXL disposed on the substrate SUB and including at least one light emitting element LD, a driver (not shown) disposed on the substrate SUB and driving the pixels PXL, and one or more lines (not shown) connecting the pixels PXL and the driver to each other.

The display device may be classified into a passive matrix display device and an active matrix display device according to a method of driving the light emitting element LD. For example, in case that the display device may be implemented as an active matrix type, each of the pixels PXL may include a driving transistor that controls a current amount supplied to the light emitting element LD, a switching transistor that transfers a data signal to the driving transistor, and the like.

Recently, an active matrix display device that may select and light each pixel PXL in terms of resolution, contrast, and operation speed has become mainstream. However, the invention is not limited thereto. For example, a passive matrix in which lighting may be performed for each group of the pixel PXL may also use components (for example, the first and second electrodes) for driving a light emitting element LD.

The substrate SUB may include a display area DA and a non-display area NDA.

According to an embodiment, the display area DA may be disposed in a center area of the display device, and the non-display area NDA may be disposed at an edge area of the display device to surround the display area DA. However, positions of the display area DA and the non-display area NDA are not limited thereto, and the positions of the display area DA and the non-display area NDA may be changed.

The display area DA may be an area where the pixels PXL that may display an image may be provided. The non-display area NDA may be an area where the driver that may drive the pixels PXL and a portion of the one or more lines connecting the pixels PXL and the driver to each other may be provided.

The display area DA may have various shapes. For example, the display area DA may be disposed as a polygon of a closed shape including a side formed of a straight line. The display area DA may be disposed in a circular shape and/or an elliptical shape including a side formed of a curve. The display area DA may be disposed in various shapes such as a semicircle, a semi-ellipse, and the like including a side formed of a straight line and a curve.

The non-display area NDA may be disposed on at least a side of the display area DA. In an embodiment of the invention, the non-display area NDA may surround a periphery (or edge) of the display area DA.

The substrate SUB may include a transparent insulating material and may transmit light.

The substrate SUB may be a rigid substrate. For example, the rigid substrate may be one of a glass substrate, a quartz substrate, a glass ceramic substrate, and a crystalline glass substrate, or a combination thereof.

The substrate SUB may be a flexible substrate. Here, the flexible substrate may be one of a film substrate and a plastic substrate including a polymer organic material, or a combination thereof. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material of the substrate SUB may be variously changed, and may include fiber reinforced plastic (FRP) or the like.

An area on the substrate SUB may be disposed as the display area DA to dispose the pixels PXL, and the remaining area on the substrate SUB may be disposed as the non-display area NDA. For example, the substrate SUB may include the display area DA including pixels PXL, and the non-display area NDA disposed around the display area DA.

Each of the pixels PXL may be disposed in the display area DA on the substrate SUB. In an embodiment of the invention, the pixels PXL may be arranged in the display area DA in a pentile array structure.

As shown in FIG. 5, the pixels PXL may include a first sub pixel SPX1, a second sub pixel SPX2, a third sub pixel SPX3, and a fourth sub pixel SPX4. According to an embodiment, the first sub pixel SPX1 may be red R, the second sub pixel SPX2 may be blue B, and the third sub pixel SPX3 and the fourth sub pixel SPX4 may be green G.

For example, the pixels PXL may be a diamond pentile array having an RGBG structure. In a pixel PX of the diamond pentile, the first sub pixel R and the fourth sub pixel G may be disposed in a diagonal direction (a direction between a first direction DR1 and a second direction DR2), and the second sub pixel B and the third sub pixel G may be disposed in a diagonal direction.

However, the colors of the first to fourth sub pixels SPX1 to SPX4 are not limited thereto. The first to fourth sub pixels SPX1 to SPX4 may be different colors. For example, the first sub pixel SPX1 may be red, the second sub pixel SPX2 may be blue, the third sub pixel SPX3 may be green, and the fourth sub pixel SPX4 may be white. The first to fourth sub pixels SPX1 to SPX4 will be described later in detail with reference to FIG. 7 in which a region A is enlarged.

Each of the pixels PXL may include at least one light emitting element LD driven by corresponding scan signal and data signal. The light emitting element LD may have a size as small as about a micro scale or about a nano scale and may be connected in parallel with adjacent light emitting elements, but the invention is not limited thereto. The light emitting element LD may configure a light source of each of the pixels PXL.

Each of the pixels PXL may include at least one light source driven by a signal (for example, a scan signal and a data signal) and/or power (for example, a first driving power and a second driving power). For example, each of the pixels PXL may include at least one micro light emitting element LD having a small size of about a nano scale to about a micro scale, as shown in each of the embodiments of FIGS. 1A to 4B. However, the type of the light emitting element LD that may be used as the light source of each of the pixels PXL is not limited thereto.

In an embodiment of the invention, the color, type, and/or number of the pixels PXL is not particularly limited, and for example, the color of light emitted from each pixel PXL may be variously changed.

The driver may provide a signal and a power to each pixel PXL through the one or more lines, thereby controlling driving of the pixel PXL. In FIG. 5, the one or more lines are omitted for convenience of description.

The driver may include a scan driver that provides a scan signal to the pixels PXL through a scan line, a light emission driver that provides a light emission control signal to the pixels PXL through a light emission control line, a data driver that provides a data signal to the pixels PXL through a data line, and a timing controller. The timing controller may control the scan driver, the light emission driver, and the data driver.

FIGS. 6A to 6E are schematic circuit diagrams illustrating an electrical connection relationship between components that may be included in a pixel shown in FIG. 5, according to various embodiments.

For example, FIGS. 6A to 6E show electrical connection relationships between the components included in the pixel PXL that may be applied to an active display device, according to different embodiments. However, types of the components included in the pixel PXL to which an embodiment of the invention may be applied are not limited thereto.

In FIGS. 6A to 6E, not only the components included in each of the pixels shown in FIG. 5, but also an area where the components may be disposed may be referred to as the pixel PXL. According to an embodiment, each pixel PXL shown in FIGS. 6A to 6E may be any of the pixels PXL included in the display device of FIG. 5, and the pixels PXL may have substantially the same or similar structure.

Referring to FIGS. 1A to 4B, 5, and 6A to 6E, one pixel PXL (hereinafter referred to as a pixel) may include a light emitting part EMU that generates light of a luminance corresponding to the data signal. The pixel PXL may selectively further include a pixel circuit 144 for driving the light emitting part EMU.

According to an embodiment, the light emitting part EMU may include light emitting elements LD connected in parallel between a first power line PL1 to which first driving power VDD may be applied and a second power line PL2 to which second driving power VSS may be applied. For example, the light emitting part EMU may include a first electrode EL1 (or a "first alignment electrode") connected to the first driving power VDD via the pixel circuit 144 and the first power line PL1, a second electrode EL2 (or a "second alignment electrode") connected to the second driving power VSS via the second power line PL2, and the light emitting elements LD that may be connected in parallel in the same direction. In an embodiment of the invention, the first electrode EL1 may be an anode electrode, and the second electrode EL2 may be a cathode electrode.

In an embodiment, each of the light emitting elements LD included in the light emitting part EMU may include a first end portion connected to the first driving power VDD through the first electrode EL1 and a second end portion connected to the second driving power VSS through the second electrode EL2. The first driving power VDD and the second driving power VSS may have different potentials. For example, the first driving power VDD may be set as a high potential power, and the second driving power VSS may be set as a low potential power. A potential difference between the first driving power VDD and the second driving power VSS may be set as a threshold voltage or more of the light emitting elements LD during a light emission period of the pixel PXL.

As described above, the respective the light emitting elements LD that may be connected in parallel in the same direction (for example, a forward direction) between the first electrode EL1 and the second electrode EL2 to which voltages of different potentials are supplied may configure respective effective light sources. Such effective light sources may be gathered to form the light emitting part EMU of the pixel PXL.

The light emitting elements LD of the light emitting part EMU may emit light at a luminance corresponding to a driving current supplied through the corresponding pixel circuit 144. For example, the pixel circuit 144 may supply a driving current corresponding to a grayscale value of corresponding frame data to the light emitting part EMU during each frame period. The driving current supplied to the light emitting part EMU may be divided and flow to the light emitting elements LD connected in the same direction. Therefore, each of the light emitting elements LD may emit light at a luminance corresponding to the current flowing through the light emitting element LD, and thus the light emitting part EMU may emit light of the luminance corresponding to the driving current.

Figure 6A:
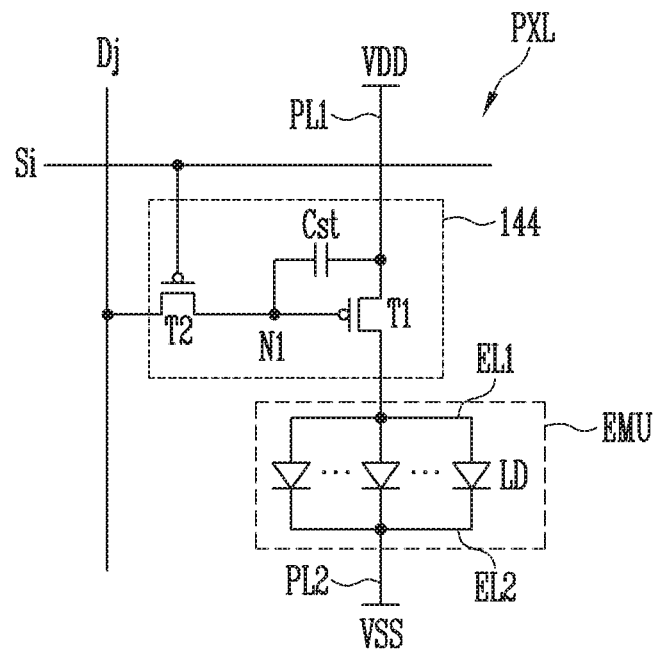
FIGS. 6A to 6E are schematic circuit diagrams illustrating an electrical connection relationship between components included in a pixel shown in FIG. 5, according to various embodiments.
Figure 6B:
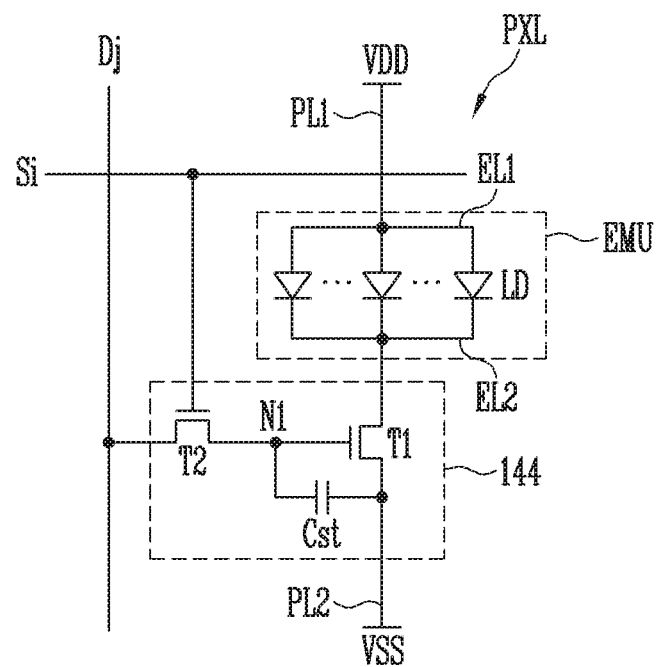
Figure 6C:
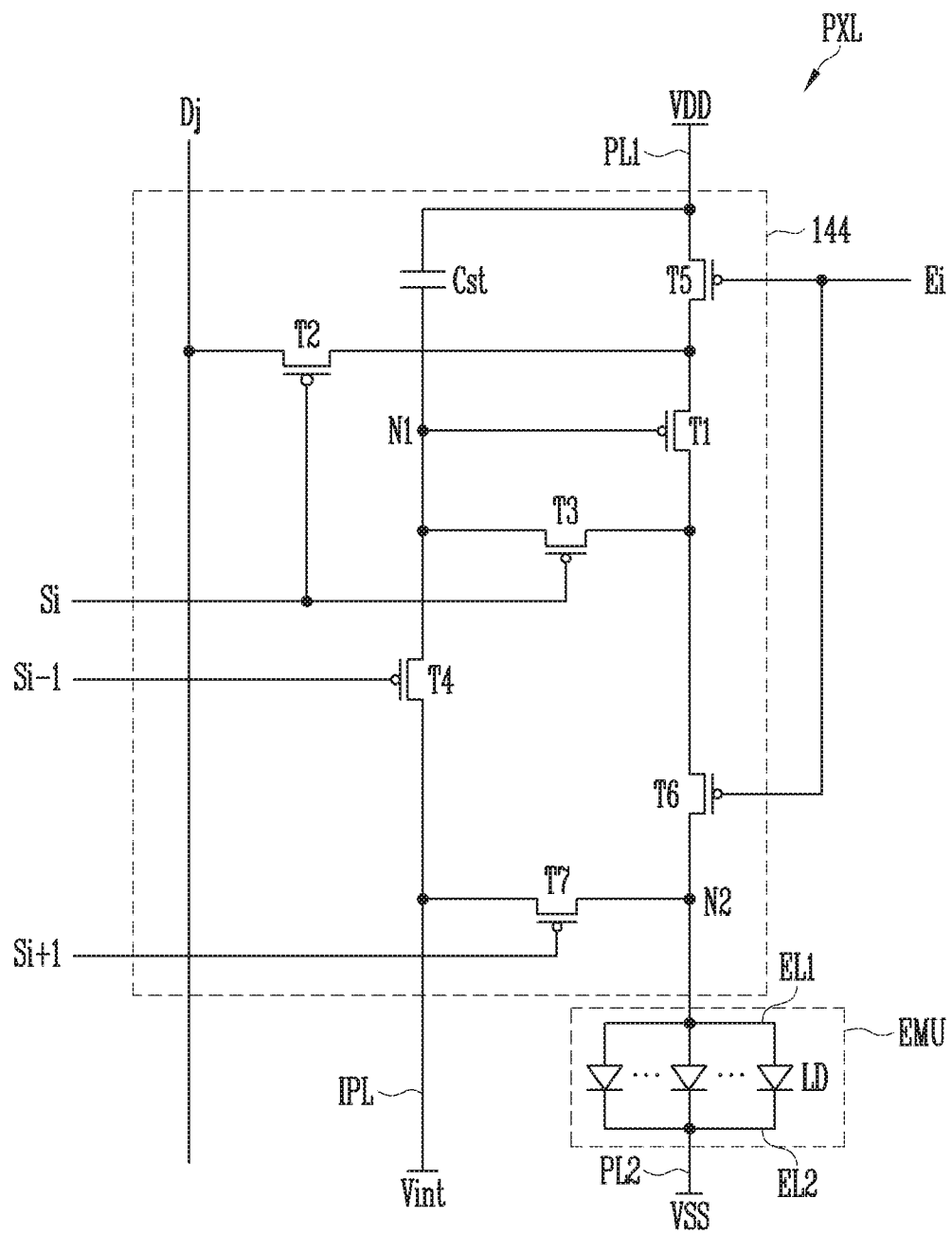
Figure 6D:
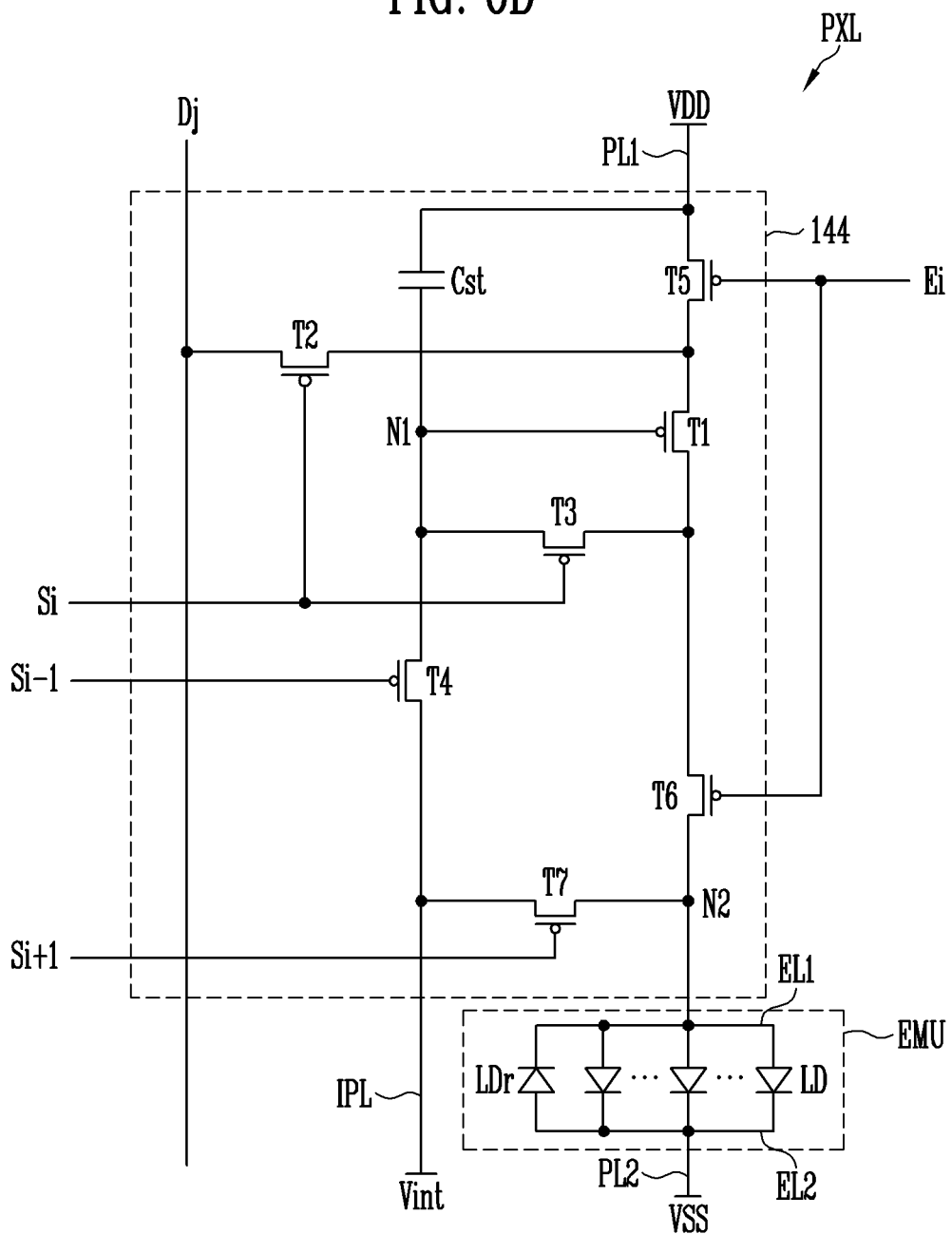
Figure 6E:
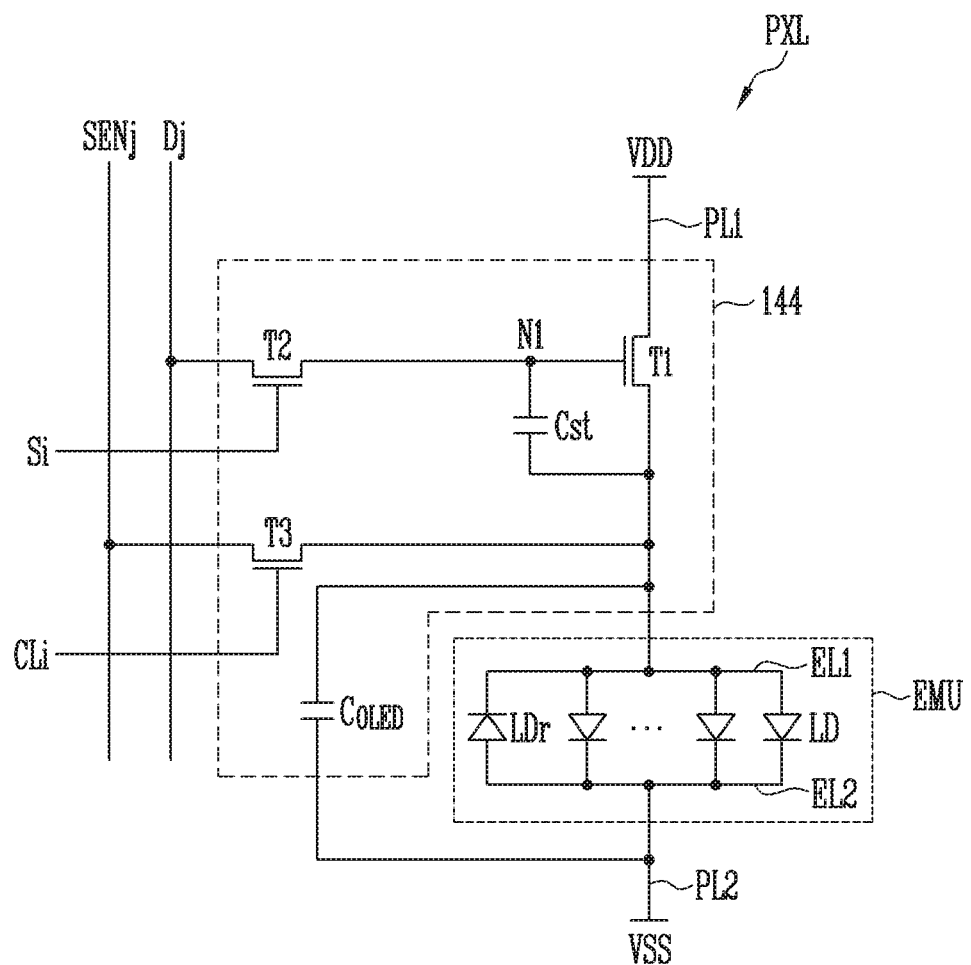

FIGS. 6A to 6E show an embodiment in which the light emitting elements LD may be connected in the same direction between the first driving power VDD and the second driving power VSS, but the invention is not limited thereto. According to an embodiment, the light emitting part EMU may further include at least one ineffective light source in addition to the light emitting elements LD of each effective light source. For example, at least a reverse light emitting element LDr may be further connected between the first and second electrodes EL1 and EL2 of the light emitting part EMU, as shown in FIGS. 6D and 6E. The reverse light emitting element LDr may be connected in parallel between the first and second electrodes EL1 and EL2 together with the light emitting elements LD of the effective light sources, and may be connected to the first and second electrodes EL1 and EL2 in a direction opposite to the light emitting elements LD. The reverse light emitting element LDr may maintain an inactive state even though a driving voltage (for example, a forward driving voltage) may be applied between the first and second electrodes EL1 and EL2, and thus a current substantially may not flow through the reverse light emitting element LDr.

The pixel circuit 144 may be connected to a scan line Si and a data line Dj of a corresponding pixel PXL. For example, in case that the pixel PXL is disposed in an i-th (i may be a natural number) row and a j-th (j may be a natural number) column of the display area DA, the pixel circuit 144 of the pixel PXL may be connected to the i-th scan line Si and the j-th data line Dj of the display area DA. According to an embodiment, the pixel circuit 144 may include first and second transistors T1 and T2 and a storage capacitor Cst as shown in FIGS. 6A and 6B. However, a structure of the pixel circuit 144 is not limited to the embodiment shown in FIGS. 6A and 6B.

First, referring to FIG. 6A, the pixel circuit 144 may include the first and second transistors T1 and T2 and the storage capacitor Cst.

A first terminal of the second transistor T2 (switching transistor) may be connected to the data line Dj, and a second terminal may be connected to a first node N1. Here, the first terminal and the second terminal of the second transistor T2 may be different terminals. For example, in case that the first terminal is a source electrode, the second terminal may be a drain electrode. A gate electrode of the second transistor T2 may be connected to the scan line Si.

The second transistor T2 may be turned on in case that a scan signal of a voltage (for example, a low voltage) at which the second transistor T2 may be turned on from the scan line Si may be supplied, to electrically connect the data line Dj and the first node N1 to each other. At this time, a data signal of a corresponding frame may be supplied to the data line Dj, and thus the data signal may be transferred to the first node N1. The data signal transferred to the first node N1 may be charged in the storage capacitor Cst.

A first terminal of the first transistor T1 (driving transistor) may be connected to the first driving power VDD, and a second terminal may be electrically connected to the first electrode EL1 of each of the light emitting elements LD. A gate electrode of the first transistor T1 may be connected to the first node N1. The first transistor T1 may control an amount of the driving current supplied to the light emitting elements LD in correspondence with a voltage of the first node N1.

One electrode of the storage capacitor Cst may be connected to the first driving power VDD, and another electrode may be connected to the first node N1. The storage capacitor Cst may charge a voltage corresponding to the data signal supplied to the first node N1 and may maintain the charged voltage until the data signal of a subsequent (e.g., next) frame may be supplied.

Each of FIGS. 6A and 6B shows the pixel circuit 144 including the second transistor T2 for transferring the data signal into the pixel PXL, the storage capacitor Cst for storing the data signal, and the first transistor T1 for supplying the driving current corresponding to the data signal to the light emitting elements LD.

However, the invention is not limited thereto, and the structure of the pixel circuit 144 may be variously modified and implemented. For example, the pixel circuit 144 may further include other circuit elements such as a transistor element for compensating for a threshold voltage of the first transistor T1, a transistor element for initializing the first node N1, and/or a transistor element for controlling a light emission time of the light emitting element LD, or a boosting capacitor for boosting the voltage of the first node N1.

In FIG. 6A, the transistors included in the pixel circuit 144 (for example, the first and second transistors T1 and T2) may be P-type transistors, but the invention is not limited thereto.

For example, at least one of the first and second transistors T1 and T2 included in the pixel circuit 144 may be changed to an N-type transistor.

Referring to FIGS. 1A to 4B, 5, and 6B, according to an embodiment of the invention, the first and second transistors T1 and T2 may be implemented as N-type transistors. A configuration or an operation of the pixel circuit 144 shown in FIG. 6B may be similar to that of the pixel circuit 144 of FIG. 6A except for a connection position change of some components due to a transistor type change. Therefore, description thereof will be briefly given.

In an embodiment of the invention, the pixel circuit 144 shown in FIG. 6B may include the first and second transistors T1 and T2 formed of the N-type transistors, and the storage capacitor Cst. In case that the first and second transistors T1 and T2 are formed of the N-type transistors, the light emitting part EMU may be connected between the first driving power VDD and the pixel circuit 144 for stabilization of the storage capacitor Cst that may charge the voltage corresponding to the data signal supplied to the first node N1. However, the invention is not limited thereto. According to an embodiment, the light emitting part EMU shown in FIG. 6B may be connected between the pixel circuit 144 and the second driving power VSS. In an embodiment of the invention, the configuration of the pixel circuit 144 is not limited to the embodiments shown in FIGS. 6A and 6B. For example, the pixel circuit 144 may be configured as in an embodiment shown in FIGS. 6C and 6D.

As shown in FIGS. 6C and 6D, the pixel circuit 144 may be connected to the scan line Si and the data line Dj of the pixel PXL. For example, in case that the pixel PXL is disposed in the i-th row and the j-th column of the display area DA, the pixel circuit 144 of the pixel PXL may be connected to the i-th scan line Si and the j-th data line Dj of a corresponding pixel PXL.

According to an embodiment, the pixel circuit 144 may be further connected to at least another scan line. For example, the pixel PXL disposed in the i-th row of the display area DA may be further connected to an (i−1)-th scan line Si−1 and/or an (i+1)-th scan line Si+1. According to an embodiment, the pixel circuit 144 may be further connected to third power in addition to the first driving power VDD and the second driving power VSS. For example, the pixel circuit 144 may also be connected to initialization power Vint.

The pixel circuit 144 may include first to seventh transistors T1 to T7 and a storage capacitor Cst.

One electrode, for example, a source electrode of the first transistor T1 (driving transistor) may be connected to the first driving power VDD via the fifth transistor T5, and another electrode, for example, a drain electrode may be connected to a side end portion of the light emitting elements LD via the sixth transistor T6. A gate electrode of the first transistor T1 may be connected to the first node N1. The first transistor T1 may control the driving current flowing between the first driving power VDD and the second driving power VSS via the light emitting elements LD in correspondence with the voltage of the first node N1.

The second transistor T2 (switching transistor) may be connected between the j-th data line Dj connected to the pixel PXL and the source electrode of the first transistor T1. A gate electrode of the second transistor T2 may be connected to the i-th scan line Si connected to the pixel PXL. The second transistor T2 may be turned on in case that a scan signal of a gate-on voltage (for example, a low voltage) may be supplied from the i-th scan line Si, to electrically connect the j-th data line Dj to the source electrode of the first transistor T1. Therefore, in case that the second transistor T2 is turned on, the data signal supplied from the j-th data line Dj may be transferred to the first transistor T1.

The third transistor T3 may be connected between the drain electrode of the first transistor T1 and the first node N1. A gate electrode of the third transistor T3 may be connected to the i-th scan line Si. The third transistor T3 may be turned on in case that the scan signal of the gate-on voltage may be supplied from the i-th scan line Si, to electrically connect the drain electrode of the first transistor T1 and the first node N1 to each other.

The fourth transistor T4 may be connected between the first node N1 and an initialization power line IPL to which the initialization power Vint may be applied. A gate electrode of the fourth transistor T4 may be connected to a previous scan line, for example, the (i−1)-th scan line Si−1. The fourth transistor T4 may be turned on in case that the scan signal of the gate-on voltage may be supplied to the (i−1)-th scan line Si−1, to transfer a voltage of the initialization power Vint to the first node N1. Here, the initialization power Vint may have a voltage equal to or less than the lowest voltage of the data signal.

The fifth transistor T5 may be connected between the first driving power VDD and the first transistor T1. A gate electrode of the fifth transistor T5 may be connected to a corresponding light emission control line, for example, an i-th light emission control line Ei. The fifth transistor T5 may be turned off in case that a light emission control signal of a gate-off voltage may be supplied to the i-th light emission control line Ei, and may be turned on in other cases.

The sixth transistor T6 may be connected between the first transistor T1 and the end portion of the light emitting elements LD. A gate electrode of the sixth transistor T6 may be connected to the i-th light emission control line Ei. The sixth transistor T6 may be turned off in case that the light emission control signal of the gate-off voltage may be supplied to the i-th light emission control line Ei, and may be turned on in other cases.

The seventh transistor T7 may be connected between the end portion of the light emitting elements LD and the initialization power line IPL. A gate electrode of the seventh transistor T7 may be connected to any of subsequent (e.g., next) scan lines, for example, the (i+1)-th scan line Si+1. The seventh transistor T7 may be turned on in case that the scan signal of the gate-on voltage may be supplied to the (i+1)-th scan line Si+1, to supply the voltage of the initialization power Vint to the end portion of the light emitting elements LD.

The storage capacitor Cst may be connected between the first driving power VDD and the first node N1. The storage capacitor Cst may store a data signal supplied to the first node N1 and a voltage corresponding to the threshold voltage of the first transistor T1 during each frame period.

In FIGS. 6C and 6D, the transistors included in the pixel circuit 144 (for example, the first to seventh transistors T1 to T7) may be P-type transistors, but the invention is not limited thereto. For example, at least one of the first to seventh transistors T1 to T7 may be changed to an N-type transistor.

In an embodiment of the invention, the configuration of the pixel circuit 144 is not limited to the embodiments shown in FIGS. 6A to 6D. For example, the pixel circuit 144 may be configured as in the embodiment shown in FIG. 6E.

The pixel circuit 144 may be further connected to a control line CLi and a sensing line SENj as shown in FIG. 6E. For example, the pixel circuit 144 of the pixel PXL disposed in the i-th row and the j-th column of the display area DA may be connected to an i-th control line CLi and a j-th sensing line SENj of the display area DA. The above-described pixel circuit 144 may further include a third transistor T3 in addition to the first and second transistors T1 and T2 shown in FIGS. 6A and 6B.

The third transistor T3 may be connected between the first transistor T1 and the sensing line SENj. For example, an electrode of the third transistor T3 may be connected to the terminal (for example, the source electrode) of the first transistor T1 connected to the first electrode EL1, and another electrode of the third transistor T3 may be connected to the sensing line SENj. In case that the sensing line SENj may be omitted, a gate electrode of the third transistor T3 may be connected to the data line Dj.

According to an embodiment, a gate electrode of the third transistor T3 may be connected to the control line CLi. In case that the control line CLi is omitted, the gate electrode of the third transistor T3 may be connected to the scan line Si. The third transistor T3 may be turned on by a control signal of a gate-on voltage (for example, a high level) supplied to the control line CLi during a sensing period, to electrically connect the sensing line SENj and the second transistor T2 to each other.

According to an embodiment, a sensing period may be a period for extracting characteristic information (for example, the threshold voltage or the like of the first transistor T1) of each of the pixels PXL disposed in the display area DA. During the above-described sensing period, the first transistor T1 may be turned on by supplying a reference voltage at which the first transistor T1 may be turned on to the first node N1 through the data line Dj and the second transistor T2, or connecting each pixel PXL to a current source or the like. The first transistor T1 may be connected to the sensing line SENj by supplying the control signal of the gate-on voltage to the third transistor T3 to turn on the third transistor T3. Therefore, the characteristic information of each pixel PXL including the threshold voltage or the like of the first transistor T1 may be extracted through the sensing line SENj. The extracted characteristic information may be used to convert image data so that a characteristic deviation between the pixels PXL may be compensated.

FIG. 6E discloses an embodiment in which all of the first to third transistors T1 to T3 may be N-type transistors, but the invention is not limited thereto. For example, at least one of the above-described first to third transistors T1 to T3 may be changed to a P-type transistor. FIG. 6E discloses an embodiment in which the light emitting part EMU may be connected between the pixel circuit 144 and the second driving power VSS, but the light emitting part EMU may be connected between the first driving power VDD and the pixel circuits 144.

FIGS. 6A to 6E show an embodiment in which all of the light emitting elements LD of each light emitting part EMU may be connected in parallel, but the invention is not limited thereto. According to an embodiment, the light emitting part EMU may include at least one series stage including light emitting elements LD connected in parallel with each other. For example, the light emitting part EMU may be configured in a serial/parallel mixed structure.

The structure of a pixel PXL that may be applied according to the disclosure is not limited to the embodiments shown in FIGS. 6A to 6E, and the corresponding pixel may have various structures. In another embodiment of the invention, each pixel PXL may be configured inside a passive light emitting display device or the like. The pixel circuit 144 may be omitted, and each of the end portions of the light emitting elements LD included in the light emitting part EMU may be connected (e.g., directly connected) to the scan lines Si−1, Si, Si+1, the data line Dj, the first power line PL1 to which the first driving power VDD is applied, the second power line PL2 to which the second driving power VSS is applied, and/or a control line.

Figure 7:
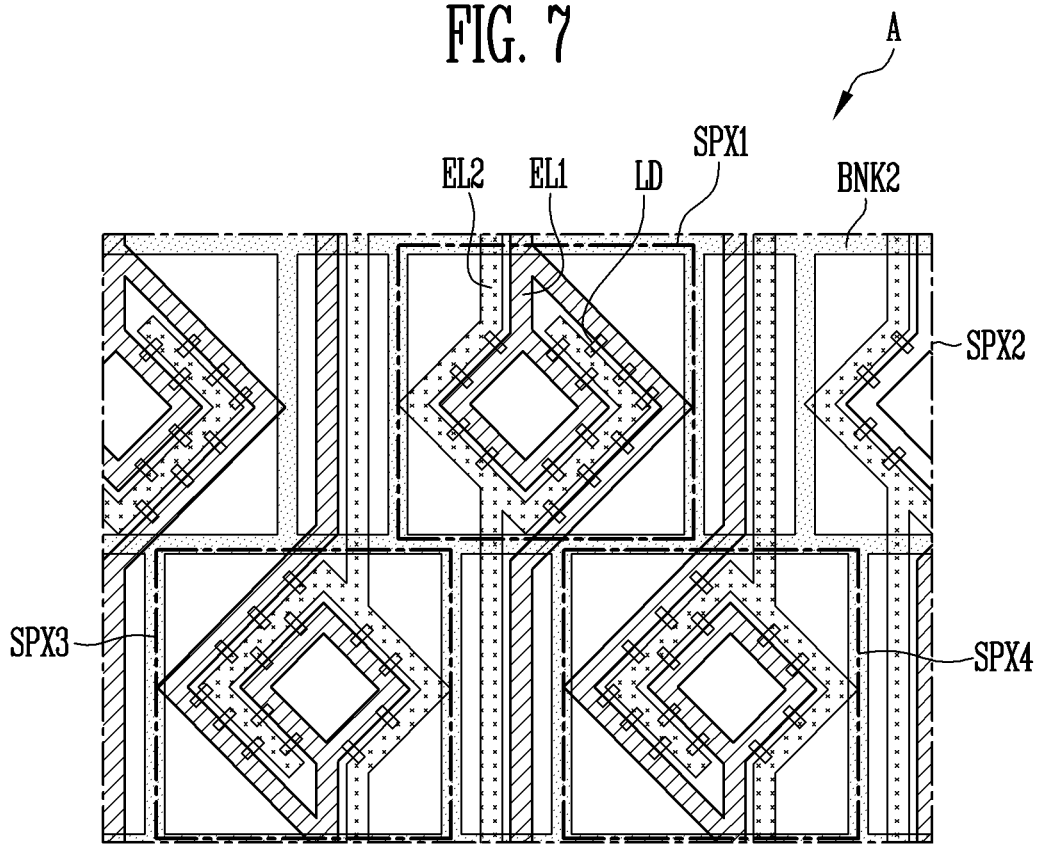
FIG. 7 is an enlarged view of a region A of FIG. 5.

FIG. 7 is an enlarged view of the region A of FIG. 5.

Referring to FIGS. 5 and 7, the display device may include first and second electrodes EL1 and EL2, light emitting elements LD, and a second bank BNK2 (BNK1 described below) in a display area DA.

According to an embodiment of the invention, the first and second electrodes EL1 and EL2 may be disposed adjacent to each other along the first direction DR1 and may be extended generally along the second direction DR2. The first and second electrodes EU and EL2 may be extended to a non-display area NDA that may be outside of the display area DA.

The first electrodes EL1 may be spaced apart from the second electrodes EL2. For example, the first electrodes EL1 may not be electrically and/or physically connected to the second electrodes EL2.

The first electrodes EL1 may include a loop (e.g., a closed loop) having, for example, a circular shape or a polygonal shape. However, the embodiments of the shape of the first electrodes EL1 are not limited thereto. For example, the closed loop may have a diamond shape. The second electrodes EL2 may include a structure extending to surround the closed loop of the first electrodes EL1 in some sections.

The light emitting elements LD may be disposed between the first electrodes EU and the second electrodes EL2.

The second bank BNK2 may be disposed in a peripheral area of the closed loop of the first electrodes EL1. The second bank BNK2 may be disposed to overlap some sections of the first and second electrodes EL1 and EL2 in a thickness direction.

Hereinafter, the sub pixel SPX1 will be described in detail with reference to FIGS. 8 to 10.

Figure 8:
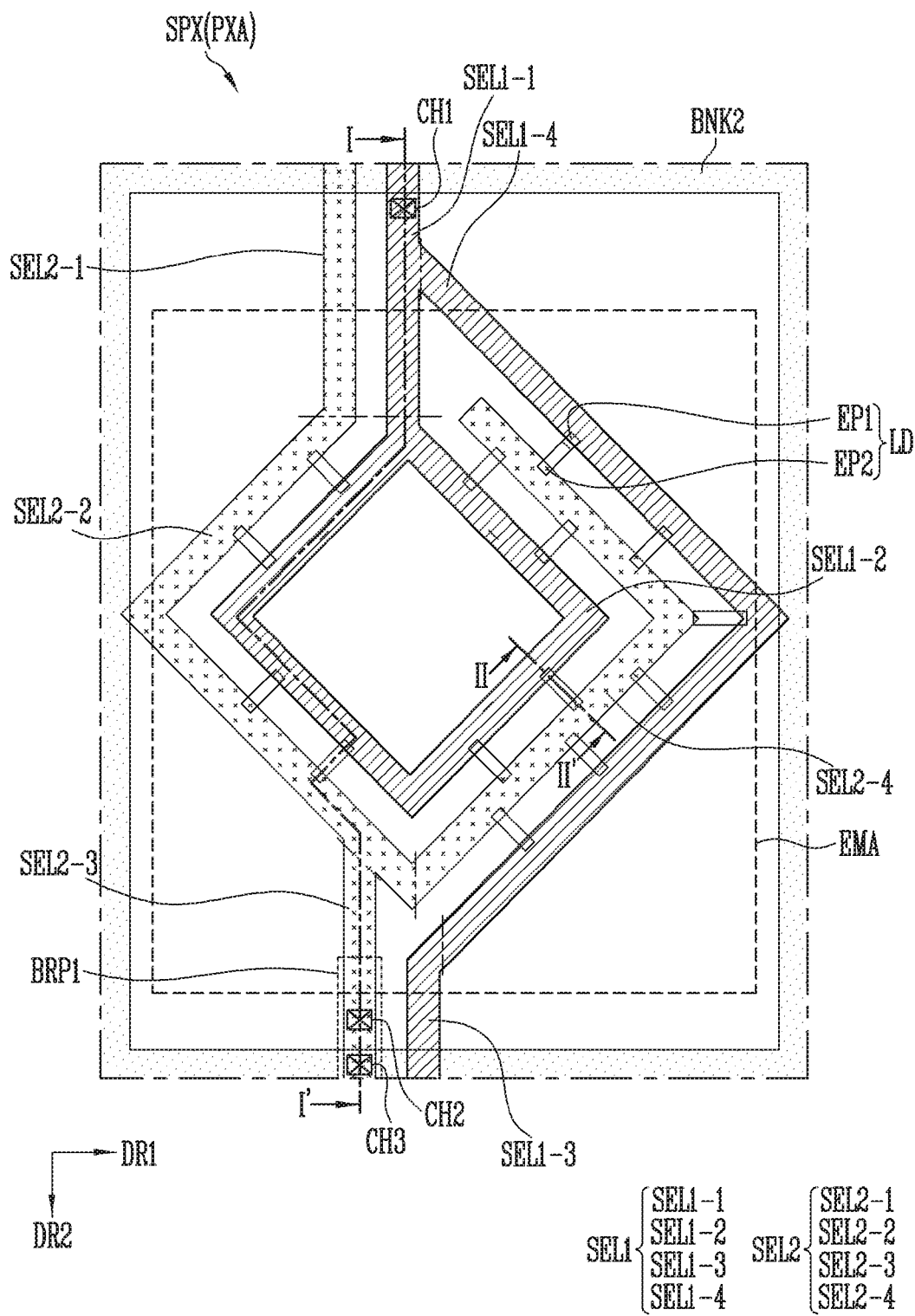
FIG. 8 is a diagram schematically illustrating a sub pixel of FIG. 7.

FIG. 8 is a diagram schematically illustrating the sub pixel of FIG. 7 according to an embodiment of the invention. FIG. 9 is a schematic cross-sectional view taken along line I-I' of FIG. 8. FIG. 10 is a schematic cross-sectional view taken along line II-II' of FIG. 8.

The sub pixel shown in FIG. 8 may be any of the sub pixels shown in each of FIGS. 6A to 6E.

In FIG. 8, for convenience of description, the transistors connected to the light emitting elements LD and the signal lines connected to the transistors are omitted.

Figure 9:
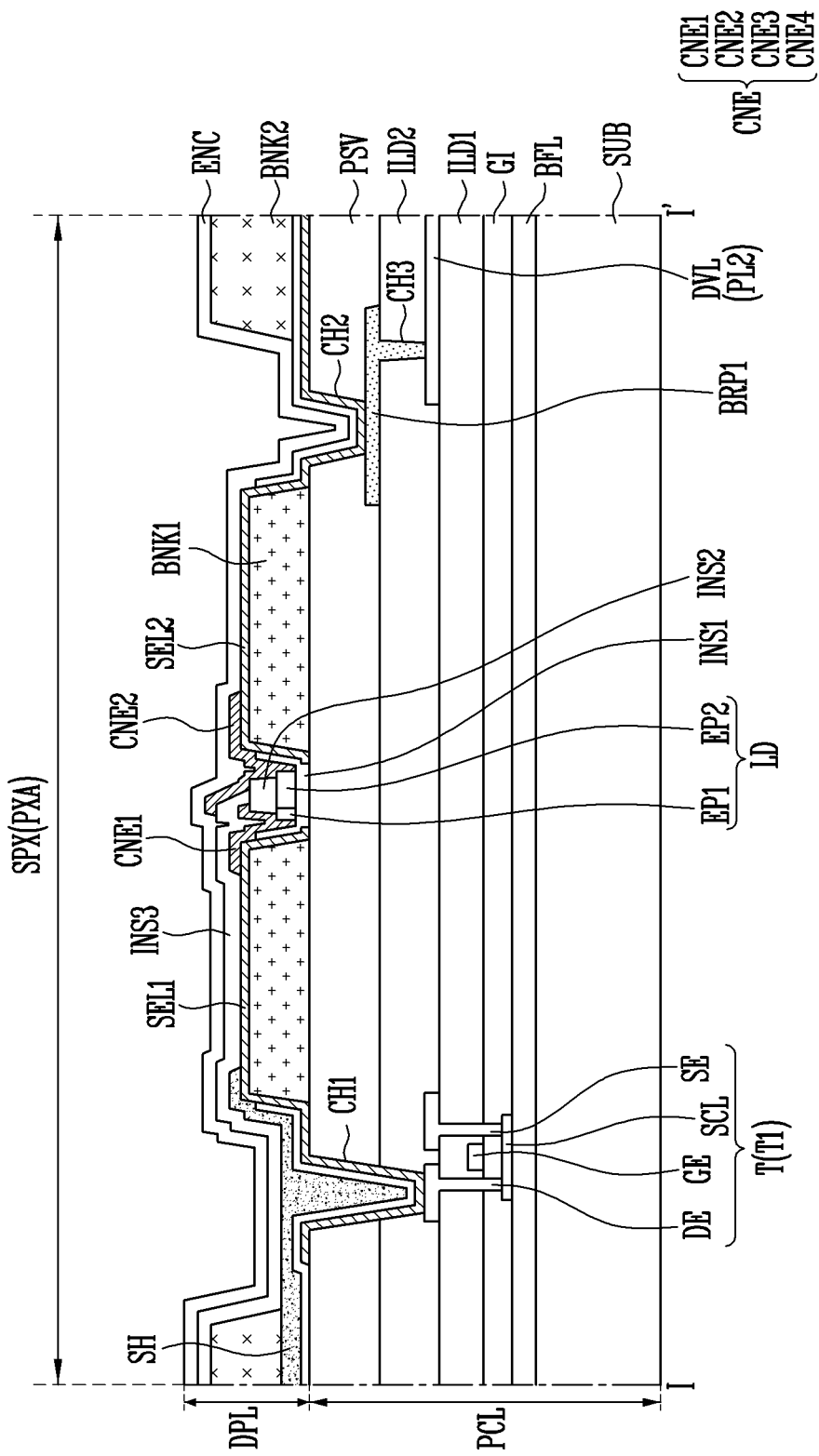
FIG. 9 is a schematic cross-sectional view taken along line I-I' of FIG. 8.
Figure 10:
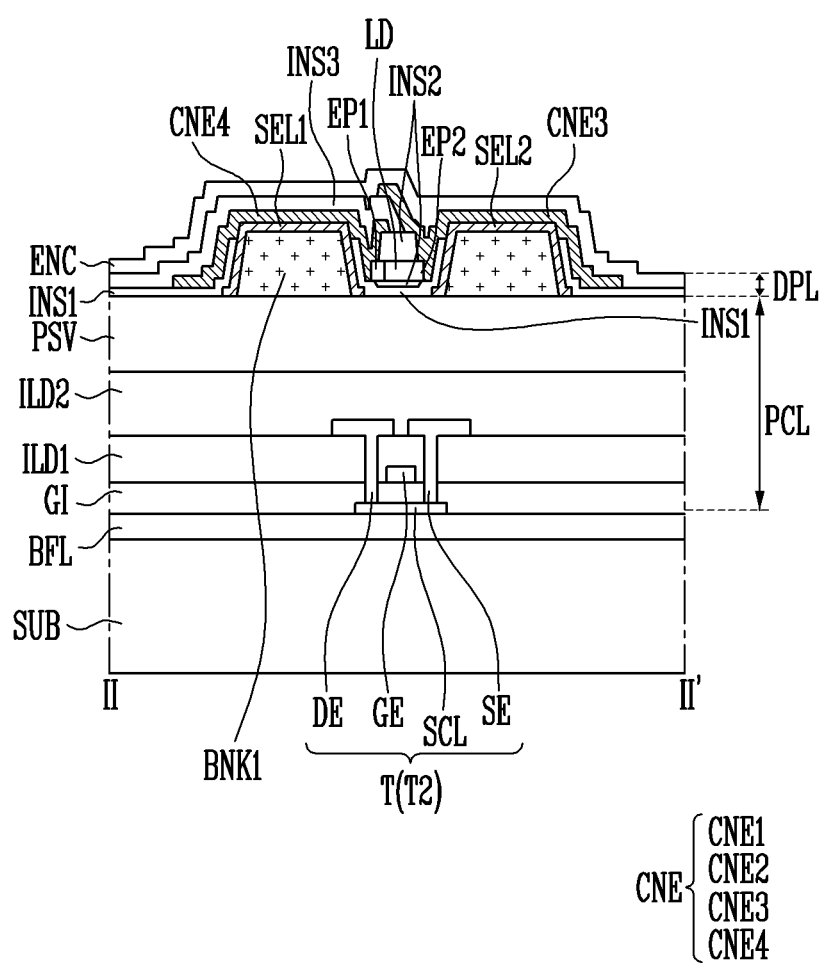
FIG. 10 is a schematic cross-sectional view taken along line II-II' of FIG. 8.

FIGS. 8 to 10 simplify a structure of a sub pixel SPX, such as showing each electrode as a single electrode layer and each insulating layer as a single insulating layer, but the invention is not limited thereto.

In an embodiment of the invention, "formed and/or disposed in the same layer" may refer to formed in a same process, and "formed and/or disposed in different layers" may refer to formed in different processes.

Referring to FIGS. 1A to 10, the display device according to an embodiment may include the substrate SUB, the one or more lines, and the sub pixels SPX.

The substrate SUB may include a transparent insulating material and may transmit light. The substrate SUB may be a rigid substrate or a flexible substrate. The material applied to the substrate SUB may have resistance (e.g., heat resistance) to a high process temperature in a manufacturing process of the display device. The substrate SUB may include the display area DA that may include at least one sub pixel region PXA on which the pixel PXL may be disposed, and the non-display area NDA that may be disposed around the display area DA.

The sub pixel region PXA in which a sub pixel SPX may be disposed may include a light emission area EMA in which light may be emitted and a peripheral area that may surround a periphery of the light emission area EMA. In an embodiment of the invention, the peripheral area may include a non-light emission area in which light may not be emitted.

Each sub pixel SPX may include the substrate SUB, a pixel circuit portion PCL in which the pixel circuit 144 may be disposed (or formed), and a display element portion DPL in which at least one light emitting element LD may be provided.

The display element portion DPL may be positioned in the light emission area EMA of the sub pixel region PXA.

The pixel circuit portion PCL may include a buffer film BFL, the pixel circuit 144 including one or more transistors T, a driving voltage line DVL, and a protective film PSV.

The buffer film BFL may prevent an impurity from being diffused into the transistor T. The buffer film BFL may include an inorganic insulation film including an inorganic material. For example, the buffer film BFL may include at least one of metal oxides such as silicon nitride (SiNx), silicon oxide (SiOx), silicon oxynitride (SiON), and AlOx. The buffer film BFL may be disposed as a single film, but may be disposed as multiple films of two or more layers. In case that the buffer film BFL is disposed in multiple films, each layer may be formed of the same material or different materials. The buffer film BFL may be omitted according to the material of the substrate SUB, a process condition, and the like.

The transistor T may include the first transistor T1, which may be the driving transistor that may control the amount of the driving current supplied to the light emitting elements LD, and the second transistor T2, which may be the switching transistor. In an embodiment of the invention, the first transistor T1 may be the first transistor T1 of the pixel circuit 144 described with reference to FIGS. 6A to 6E, and the second transistor T2 may be the second transistor T2 of the pixel circuit 144 described with reference to FIGS. 6A to 6E.

Each of the first transistors T1 and T and the second transistors T2 and T may include a transistor semiconductor pattern SCL, a gate electrode GE, a first terminal SE, and a second terminal DE. The first terminal SE may be any one of a source electrode and a drain electrode, and the second terminal DE may be another remaining electrode. For example, in case that the first terminal SE is the source electrode, the second terminal DE may be the drain electrode.

The transistor semiconductor pattern SCL may be disposed and/or formed on the buffer film BFL. The transistor semiconductor pattern SCL may include a first contact region that may be in contact with the first terminal SE and a second contact region that may be in contact with the second terminal DE. A region between the first contact region and the second contact region may be a channel region. The transistor semiconductor pattern SCL may be a semiconductor pattern formed of polysilicon, amorphous silicon, an oxide semiconductor, or the like, or a combination thereof. The channel region may be a semiconductor pattern which may not be doped with an impurity and may be an intrinsic semiconductor. The first contact region and the second contact region may be a semiconductor pattern doped with an impurity.

The gate electrode GE may be disposed and/or formed on the transistor semiconductor pattern SCL with a gate insulation film GI interposed therebetween. The gate insulation film GI may be an inorganic insulation film including an inorganic material. For example, the gate insulation film GI may include at least one of metal oxides such as silicon nitride (SiNx), silicon oxide (SiOx), silicon oxynitride (SiON), and AlOx. However, the material of the gate insulation film GI is not limited to the above-described embodiments. According to an embodiment, the gate insulation film GI may be formed of an organic insulation film including an organic material. The gate insulation film GI may be disposed as a single film, or may be disposed as multiple films of at least two or more layers. The first terminal SE and the second terminal DE may be in contact with the first contact region and the second contact region of the transistor semiconductor pattern SCL through contact holes passing through a first interlayer insulation film ILD1 and the gate insulation film GI, respectively. The first interlayer insulation film ILD1 may be an inorganic insulation film including an inorganic material. For example, the first interlayer insulation film ILD1 may include at least one of metal oxides such as silicon nitride (SiNx), silicon oxide (SiOx), silicon oxynitride (SiON), and AlOx. The first interlayer insulation film ILD1 and the gate insulation film GI may include a same material, but the invention is not limited thereto. The first interlayer insulation film ILD1 may be disposed as a single film, or may be disposed as multiple films of at least two or more layers.

In the above-described embodiment, the first and second terminals SE and DE of each of the first transistors T1 and T and the second transistors T2 and T may be separate electrodes connected to the transistor semiconductor pattern SCL. However, the invention is not limited thereto. According to an embodiment, the first terminal SE of each of the first transistors T1 and T and the second transistors T2 and T may be a region of the first and second contact regions adjacent to the channel region of a corresponding transistor semiconductor pattern SCL, and the second terminal DE of each of the first transistors T1 and T and the second transistors T2 and T may be the other region of the first and second contact regions adjacent to the channel region of the corresponding transistor semiconductor pattern SCL.

In an embodiment of the invention, the transistor T included in the pixel circuit portion PCL may be configured as an LTPS thin film transistor, but the invention is not limited thereto, and the transistor T may be configured as an oxide semiconductor thin film transistor. A case where the transistor T may be a thin film transistor of a top gate structure has been described as an example, but the invention is not limited thereto. According to an embodiment, the transistor T may be a thin film transistor of a bottom gate structure.

The driving voltage line DVL may be disposed on the first interlayer insulation film ILD1, but the invention is not limited thereto. According to an embodiment, the driving voltage line DVL may be disposed on any insulation film of insulation films included in the pixel circuit portion PCL. The second driving power VSS may be applied to the driving voltage line DVL. In an embodiment of the invention, the driving voltage line DVL may be the second power line PL2 to which the second driving power VSS may be applied in the sub pixel SPX shown in FIGS. 6A and 6E.

A second interlayer insulation film ILD2 may be disposed on the transistor T described above. The second interlayer insulation film ILD2 may cover the transistor T. The second interlayer insulation film ILD2 may be an inorganic insulation film including an inorganic material or an organic insulation film including an organic material. According to an embodiment, the second interlayer insulation film ILD2 and the first interlayer insulation film ILD1 may include a same material, but the invention is not limited thereto. The second interlayer insulation film ILD2 may be disposed as a single film, or may be disposed as multiple films of two or more layers.

The protective film PSV may be disposed on the second interlayer insulation film ILD2. The protective film PSV may be disposed in a form including an organic insulation film, an inorganic insulation film, or the organic insulation film disposed on the inorganic insulation film. Here, the inorganic insulation film may include at least one of metal oxides such as silicon oxide (SiOx), silicon nitride (SiNx), silicon oxynitride (SiON), and AlOx. The organic insulation film may include an organic insulating material capable of transmitting light. The organic insulation film may include at least one of an acrylic resin, an epoxy resin, a phenolic resin, a polyamide resin, a polyimide resin, an unsaturated polyester resin, a poly-phenylene ethers resin, a poly-phenylene sulfides resin, and a benzocyclobutene resin.

Each of the second interlayer insulation film ILD2 and the protective film PSV may include a first contact hole CH1 exposing a portion of the second terminal DE of the first transistors T1 and T.

The pixel circuit portion PCL may include a first bridge pattern BRP1 on the second interlayer insulation film ILD2.

The first bridge pattern BRP1 may be disposed in the sub pixel region PXA and may be disposed to overlap a second sub electrode SEL2 in a thickness direction. The first bridge pattern BRP1 may be extended along the second direction DR2 from a point of a seventh section SEL2-3 of the second sub electrode SEL2, which will be described later. However, a shape of the first bridge pattern BRP1 is not limited to the above-described embodiment. The first bridge pattern BRP1 may be extended from the light emission area EMA to the peripheral region positioned around the light emission area EMA.

The first bridge pattern BRP1 may be connected to the second sub electrode SEL2 included in the display element portion DPL through a second contact hole CH2 passing through the protective film PSV. The first bridge pattern BRP1 may be connected to the driving voltage lines DVL and PL2 through a third contact hole CH3 passing through the second interlayer insulation film ILD2. As the first bridge pattern BRP1 may be connected to the driving voltage lines DVL and PL2, the second driving voltage VSS applied to the driving voltage lines DVL and PL2 may be transferred to the first bridge pattern BRP1.

The display element portion DPL will be described.

The display element portion DPL of each sub pixel SPX may include a first bank BNK1, the first and second sub electrodes SEL1 and SEL2, a contact electrode CNE (CNE1, CNE2, CNE3, CNE4), and the light emitting elements LD disposed in the light emission area EMA. The display element portion DPL of each sub pixel SPX may include a second bank BNK2 disposed in the peripheral area.

The first bank BNK1 may be a support member that supports each of the first and second sub electrodes SEL1 and SEL2 positioned in the light emission area EMA so that the light emitted from the light emitting elements LD further progresses in an image display direction of the display device. The first bank BNK1 may be disposed and/or formed between the protective film PSV and the first and second sub electrodes SEL1 and SEL2. For example, in the light emission area EMA, the first bank BNK1 may be disposed and/or formed between the first sub electrode SEL1 and the protective film PSV and between the second sub electrode SEL2 and the protective film PSV.

The first bank BNK1 may include an inorganic insulation film formed of an inorganic material or an organic insulation film formed of an organic material, or a combination thereof. According to an embodiment, the first bank BNK1 may include an organic insulation film of a single film and/or an inorganic insulation film of a single film, but the invention is not limited thereto. According to an embodiment, the first bank BNK1 may be disposed in a form of multiple films in which at least one organic insulation film and at least one inorganic insulation film may be stacked on each other.

The first bank BNK1 may have a cross section of a trapezoidal shape of which a width becomes narrower from a surface of the protective film PSV toward an upper portion, but the invention is not limited thereto. According to an embodiment, the first bank BNK1 may include a curved surface having a cross section of a semi-elliptical or semi-circular shape of which the width becomes narrower from a surface of the protective film PSV toward the upper portion. Viewed in cross section, the shape of the first bank BNK1 is not limited to the above-described embodiments, and may be variously changed within a range capable of improving efficiency of the light emitted from each of the light emitting elements LD. Adjacent first banks BNK1 may be disposed on the same plane on the protective film PSV, and may have the same height.

The second bank BNK2 may surround at least a side of the light emission area EMA of each sub pixel SPX. The second bank BNK2 may be a structure defining (or partitioning) the light emission area EMA of each of the sub pixels SPX and each of the sub pixels SPX adjacent thereto. For example, the second bank BNK2 may be a pixel defining film. The second bank BNK2 may include at least one light blocking material and/or a reflective material to prevent a light leakage defect in which light leaks between each of the sub pixels SPX and the sub pixels SPX adjacent thereto. According to an embodiment, a reflective material layer may be formed on the second bank BNK2 to further improve efficiency of the light emitted from each sub pixel SPX. The second bank BNK2 may be disposed and/or formed on the protective film PSV, but the invention is not limited thereto. According to an embodiment, the second bank BNK2 may be disposed and/or formed on any insulation film among insulation films included in the display element portion DPL. According to an embodiment, a region of the second bank BNK2 may be formed on a shielding metal layer SH. The shielding metal layer SH may include an opaque metal. The opaque metal may include, for example, a metal such as Ag, Mg, Al, Pt, Pd, Au, Ni, Nd, Ir, Cr, Ti, and an alloy thereof.

The shielding metal layer SH may be disposed to overlap the first contact hole CH1 connecting the second terminal DE of the first transistor T1 and the first sub electrode SEL1 to each other, in the thickness direction.

As shown in FIG. 8, the first sub electrode SEL1 that may be a portion of the first electrode EL1 and the second sub electrode SEL2 that is may be a portion of the second electrode EL2 may be disposed in the sub pixel region PXA in which the first sub pixel SPX1 may be disposed. The first sub electrode SEL1 and the second sub electrode SEL2 may be disposed on the protective film PSV to be spaced apart from each other with an interval.

The first sub electrode SEL1 may include a first section SEL1-1, a second section SEL1-2, a third section SEL1-3, and a fourth section SEL1-4.

The first section SEL1-1 may be extended in the second direction DR2. An end of the first section SEL1-1 may be electrically and/or physically connected to a portion of the second terminal DE of the first transistors T1 and T through the first contact hole CH1. Another end of the first section SEL1-1 may be connected to the second section SEL1-2.

The second section SEL1-2 may be the closed loop of the polygonal shape described above with reference to FIG. 7. According to an embodiment, the closed loop may have a rhombus shape having four bend points. However, the shape of the closed loop is not limited thereto. For example, the second section SEL1-2 of the first sub electrode SEL1 may be a structure in which an internal cavity of the closed loop may be filled rather than a closed loop structure.

The third section SEL1-3 may be a portion of the first electrode EL1 extending (e.g., extending discontinuously) from the first section SEL1-1. For example, the third section SEL1-3 may be disposed to be spaced apart from the first section SEL1-1 and extend in the second direction DR2. An end of the third section SEL1-3 may be connected to the fourth section SEL1-4.

The fourth section SEL1-4 may be disposed to be spaced apart from the second section SEL-1-2 by an interval along a closed loop shape of the second section SEL1-2. The fourth section SEL1-4 may have a V shape along the closed loop of the rhombus shape described above. An end of the fourth section SEL1-4 may be connected to a region of the first section SEL1-1, and another end of the fourth section SEL1-4 may be connected to an end of the third section SEL1-3.

The second sub electrode SEL2 may include a fifth section SEL2-1, a sixth section SEL2-2, a seventh section SEL2-3, and an eighth section SEL2-4.

The fifth section SEL2-1 may be disposed to be spaced apart from the first section SEL1-1 of the first sub electrode SEL1 by a distance in a plan view (for example, in the first direction DR1) and may be extended in parallel to the first section SEL1-1 along the second direction DR2.

The sixth section SEL2-2 may be disposed to be spaced apart from the second section SEL1-2 of the first sub electrode SEL1 in a plan view by a distance and may be extended in parallel to the closed loop shape of the second section SEL1-2. The sixth section SEL2-2 may extend side-by-side along an outer shape of the second section SEL1-2. The sixth section SEL2-2 may have a V shape lying along the closed loop of the rhombus shape described above. An end of the sixth section SEL2-2 may be connected to an end of the fifth section SEL2-1, and another end of the sixth section SEL2-2 may be connected to an end of the seventh section SEL2-3.

The seventh section SEL2-3 may be continuously extending from the fifth section SEL2-1 via the sixth section SEL2-2. The seventh section SEL2-3 may be disposed to be spaced apart from the third section SEL1-3 of the first sub electrode SEL1 in a plan view by a distance, and may be extended in a direction equal to an extension direction (for example, the second direction DR2) of the fifth section SEL2-1.

The eighth section SEL2-4 may be disposed to be spaced apart from each of the second section SEL1-2 and the fourth section SEL1-4 of the first sub electrode SEL1 by an interval. The eighth section SEL2-4 may have a V shape along the closed loop of the rhombus shape described above. An end of the eighth section SEL2-4 may be connected to an end of the sixth section SEL2-2, and another end of the eighth section SEL2-4 may not be connected to any section of the first to seventh sections SEL1-1 to SEL1-4 and SEL2-1 to SEL2-3.

In an embodiment of the invention, intervals between the first sub electrode SEL1 and the second sub electrode SEL2 may have be the same. Therefore, the light emitting elements LD may be more uniformly aligned in the light emission area EMA. However, the invention is not limited thereto. According to an embodiment, the intervals between the first sub electrode SEL1 and the second sub electrode SEL2 may be different from each other.

Each of the first sub electrode SEL1 and the second sub electrode SEL2 may be formed of a material having a constant reflectance so that the light emitted from each of the light emitting elements LD disposed in a corresponding region may be progressed in the image display direction of the display device.

Each of the first sub electrode SEL1 and the second sub electrode SEL2 may be formed of a conductive material having a constant reflectance. The conductive material may include an opaque metal that may be advantageous for reflecting the light emitted from the light emitting elements LD in the image display direction of the display device. The opaque metal may include, for example, metal such as Ag, Mg, Al, Pt, Pd, Au, Ni, Nd, Ir, Cr, Ti, and an alloy thereof. According to an embodiment, each of the first sub electrode SEL1 and the second sub electrode SEL2 may include a transparent conductive material. The transparent conductive material may include a conductive oxide such as an indium tin oxide (ITO), an indium zinc oxide (IZO), a zinc oxide (ZnO), an indium tin zinc oxide (ITZO), conductive polymer such as PEDOT, and the like, or a combination thereof. In case that each of the first sub electrode SEL1 and the second sub electrode SEL2 includes the transparent conductive material, a separate conductive layer may be further included and may be formed of an opaque metal for reflecting the light emitted from the light emitting elements LD in the image display direction of the display device. However, the material of each of the first sub electrode SEL1 and the second sub electrode SEL2 is not limited to the above-described materials.

Each of the first sub electrode SEL1 and the second sub electrode SEL2 may be disposed and/or formed as a single film, but the invention is not limited thereto. According to an embodiment, each of the first sub electrode SEL1 and the second sub electrode SEL2 may be disposed and/or formed as multiple films in which at least two or more materials of metals, alloys, conductive oxides, and conductive polymers may be stacked on each other. Each of the first sub electrode SEL1 and the second sub electrode SEL2 may be formed as multiple films of at least two films in order to minimize distortion due to signal delay in case that a signal (or voltage) is transferred to the both end portions of each of the light emitting elements LD. For example, each of the first sub electrode SEL1 and the second sub electrode SEL2 may be formed of multiple films in which ITO, Ag, and ITO may be stacked (e.g., sequentially stacked) on each other.

As described above, since each of the first sub electrode SEL1 and the second sub electrode SEL2 may be formed of the conductive material having the constant reflectance, the light emitted from each of the light emitting elements LD may be reflected by each of the first sub electrode SEL1 and the second sub electrode SEL2 and may be progressed in the image display direction of the display device.

The light emitting elements LD may be connected in parallel between the first sub electrode SEL1 and the second sub electrode SEL2 of each sub pixel SPX. The light emitting elements LD connected in parallel may configure the light emitting part EMU of each sub pixel SPX. The first sub electrode SEL1 of each sub pixel SPX may be an anode electrode of the light emitting part EMU of each sub pixel SPX, and the second sub electrode SEL2 may be a cathode electrode of the light emitting part EMU.

In an embodiment of the invention, the first sub electrode SEL1 of each sub pixel SPX may be electrically connected to the pixel circuit 144 included in the pixel circuit portion PCL of each sub pixel SPX through the first contact hole CH1. For example, the first sub electrode SEL1 may be electrically connected to the first transistors T1 and T of the pixel circuit 144 through the first contact hole CH1.

In the above-described embodiment, each of the light emitting elements LD may be a micro light emitting element of, for example, a size as small as about a nano scale to about a micro scale, using an inorganic crystal structure material. For example, each of the light emitting elements LD may be a micro light emitting element manufactured by an etching method or a micro light emitting element manufactured by a growth method. However, the type, size, shape, and the like of the light emitting elements LD may be variously changed. At least two to tens of light emitting elements LD may be aligned and/or disposed in the light emission area EMA of each sub pixel SPX, but the number of light emitting elements LD is not limited thereto. According to an embodiment, the number of light emitting elements LD aligned and/or disposed in the light emission area EMA of each sub pixel SPX may be variously changed.

In the light emission area EMA, the light emitting elements LD may be aligned along a periphery of the second section SEL1-2 of the first sub electrode SEL1. According to an embodiment, the light emitting elements LD may be aligned radially about the second section SEL1-2 of the rhombus shape between the second section SEL1-2 of the first sub electrode SEL1 and the sixth section SEL2-2 and the eight section SEL2-4 of the second sub electrode SEL2, and between the fourth section SEL1-4 of the first sub electrode SEL1 and the eighth section SEL2-4 of the second sub electrode SEL2.

According to an embodiment, in the above-described parallel connection structure, at least one defective light emitting element, for example, an ineffective light source, in which at least one reverse light emitting element LDr connected in a reverse direction between two adjacent sub electrodes, may be further disposed.

The light emitting elements LD may be disposed in a solution in a dispersed form and may be injected into the light emission area EMA of the sub pixel SPX.

In an embodiment of the invention, the light emitting elements LD may be injected into the light emission area EMA of each sub pixel SPX through an inkjet printing method, a slit coating method, or other various methods. For example, the light emitting elements LD may be mixed with a volatile solvent and supplied to the light emission area EMA of each sub pixel SPX through an inkjet printing method or a slit coating method. At this time, in case that an alignment signal (or an alignment voltage) corresponding to each of the first and second electrodes EL1 and EL2 positioned in the light emission area EMA of each sub pixel SPX is applied, an electric field may be formed between the first and second electrodes EL1 and EL2, and thus the light emitting elements LD may be aligned between the first and second electrodes EL1 and EL2. After the light emitting elements LD may be aligned, the solvent may be volatilized or removed by other methods to provide the light emitting elements LD between the first and second electrodes EL1 and EL2.

In case that the light emitting elements LD may be aligned in the light emission area EMA of each sub pixel SPX, the first and second electrodes EL1 and EL2 may function as alignment electrodes (or alignment line) for aligning the light emitting elements LD. For example, the first electrode EL1 may be a first alignment electrode to which a first alignment signal (or first alignment voltage) may be applied, and the second electrode EL2 may be a second alignment electrode to which a second alignment signal (or second alignment voltage) may be applied.

For example, the first sub electrodes SEL1 may be first alignment electrodes, and the second sub electrodes SEL2 may be second alignment electrodes. The first alignment signal and the second alignment signal may have different voltage levels. In case that a corresponding alignment signal is applied to the first and second electrodes EL1 and EL2, an electric field may be formed between the first and second electrodes EL1 and EL2. The light emitting elements LD may be aligned in the light emission area EMA of the sub pixel SPX by the electric field formed between two adjacent sub electrodes.

After the light emitting elements LD may be aligned in the light emission area EMA of each sub pixel SPX, the first sub electrodes SEL1 and the second sub electrodes SEL2 may function as a driving electrode for driving the light emitting elements LD.

In an embodiment of the invention, in a step of aligning the light emitting elements LD in the light emission area EMA of each sub pixel SPX, the light emitting elements LD supplied to the light emission area EMA may be controlled to be relatively deflected by controlling the alignment signal (or alignment voltage) applied to each of the first and second electrodes EL1 and EL2 or forming a magnetic field. For example, in the step of aligning the light emitting elements LD, the light emitting elements LD may be controlled so that the number of light emitting elements LD arranged in a forward direction in which an end portion of both end portions EP1 and EP2 of each of the light emitting elements LD faces the first alignment electrode and the other end portion thereof faces the second alignment electrode is greater than the number of reverse light emitting elements LDr arranged in a direction opposite to the forward direction, by controlling a waveform of the alignment signal, forming the magnetic field in the light emission area EMA, or the like.

Each of the light emitting elements LD may include the first end portion EP1 electrically connected to a sub electrode of two sub electrodes adjacent to each other and the second end portion EP2 electrically connected to the other sub electrode of the two adjacent sub electrodes. In an embodiment of the invention, the first end portion EP1 of each light emitting element LD may be the first semiconductor layer 11 including an n-type semiconductor layer, and the second end portion EP2 may be the second semiconductor layer 13 including a p-type semiconductor layer. For example, in the light emission area EMA of the sub pixel SPX, each light emitting element LD may be connected in the forward direction between the two adjacent sub electrodes. As described above, the light emitting elements LD connected in the forward direction between the two adjacent sub electrodes may configure each of the effective light sources in the above-described parallel structure.

The first end portion EP1 of each of the light emitting elements LD may be connected (e.g., directly connected) to the sub electrode of the two adjacent sub electrodes, or may be connected to the sub electrode through the contact electrode CNE. The second end portion EP2 of each of the light emitting elements LD may be connected (e.g., directly connected) to the other sub electrode of the two adjacent sub electrodes, or may be electrically connected to the other sub electrode through the contact electrode CNE.

The above-described light emitting elements LD may be disposed between the adjacent first and second sub electrodes SEL1 and SEL2 on the protective film PSV. The first insulation film INS1 may be disposed between the protective film PSV and each of the light emitting elements LD to stably support the light emitting elements LD.

The first insulation film INS1 may fill a space between each of the light emitting elements LD and the protective film PSV to stably support the light emitting elements LD, and may prevent the light emitting elements LD from being separated from the protective film PSV.

In the light emission area EMA of each sub pixel SPX, the first insulation film INS1 may expose a region of each of the first and second sub electrodes SEL1 and SEL2, and may cover the remaining regions except for the exposed region. Here, the contact electrode CNE may be disposed and/or formed on a region of each of the exposed sub electrodes, and thus each of the sub electrodes and the contact electrode CNE may be electrically and/or physically connected to each other.

The first insulation film INS1 may include an inorganic insulation film formed of an inorganic material or an organic insulation film formed of an organic material. In an embodiment of the invention, the first insulation film INS1 may be formed of an inorganic insulation film that may be advantageous for protecting the light emitting elements LD from the pixel circuit portion PCL of each pixel PXL, but the invention is not limited to this. According to an embodiment, the first insulation film INS1 may be formed of an organic insulation film that may be advantageous for flattening a support surface of the light emitting elements LD.

A second insulation film INS2 may be disposed and/or formed on each of the light emitting elements LD. The second insulation film INS2 may be disposed and/or formed on each of the light emitting elements LD to cover a portion of an upper surface of each of the light emitting elements LD and expose the end portions EP1 and EP2 of each of the light emitting elements LD to the outside. The second insulation film INS2 may be formed in an independent pattern in the light emission area EMA of each pixel PXL, but the invention is not limited thereto.

The second insulation film INS2 may be configured of a single film or multiple films, and may include an inorganic insulation film including at least one inorganic material or an organic insulation film including at least one organic material, or a combination thereof. The second insulation film INS2 may fix each of the light emitting elements LD aligned in the light emission area EMA of each pixel PXL. In an embodiment of the invention, the second insulation film INS2 may include an inorganic insulation film that may be advantageous for protecting the active layer 12 of each of the light emitting elements LD from external oxygen, moisture, and the like. However, the invention is not limited thereto. The second insulation film INS2 may include an organic insulation film including an organic material according to a design condition or the like of the display device to which the light emitting elements LD may be applied.

In an embodiment of the invention, the light emitting elements LD may be prevented from being separated from the aligned positions by forming the second insulation film INS2 on the light emitting elements LD after the alignment of the light emitting elements LD may be completed in the light emission area EMA of each sub pixel SPX.

In an embodiment of the invention, the second insulation film INS2 may be formed on the light emitting elements LD so that the active layer 12 of each of the light emitting elements LD does not come into contact with an external conductive material. The second insulation film INS2 may cover only a portion of a surface of each of the light emitting elements LD to expose the end portions EP1 and EP2 of each of the light emitting elements LD to the outside.

The contact electrode CNE may be disposed and/or formed on the second insulation film INS2.

A first contact electrode CNE1 and a second contact electrode CNE2 may be disposed and/or formed on the second insulation film INS2 on the light emitting elements LD disposed in the light emission area EMA.

According to an embodiment, the first contact electrode CNE1 may be disposed on the light emitting element LD and the second insulation film INS2. A third insulation film INS3 may be disposed on the first contact electrode CNE1 and the second insulation film INS2. The second contact electrode CNE2 may be disposed on the light emitting element LD, the second insulation film INS2, and the third insulation film INS3. The third insulation film INS3 may be configured of a single film or multiple films (similar to the second insulation film INS2), and may include an inorganic insulation film including at least one inorganic material or an organic insulation film including at least one organic material, or a combination thereof. The first contact electrode CNE1 and the second contact electrode CNE2 may be electrically and/or physically separated from each other by the second insulation film INS2 and the third insulation film INS3.

An encapsulation film ENC may be disposed and/or formed on the second contact electrode CNE2 and the third insulation film INS3. The encapsulation film ENC may cover the pixel circuit portion PCL and the display element portion DPL included in each sub pixel SPX. The encapsulation film ENC may be an inorganic insulation film including an inorganic material or an organic insulation film including an organic material. For example, the encapsulation film ENC may have a structure in which at least one inorganic film and at least one organic film may be alternately stacked on each other.

Hereinafter, other embodiments will be described. In the following embodiments, the same configuration as the already described embodiments will be omitted or simplified, and a difference will be described.

Figure 11:
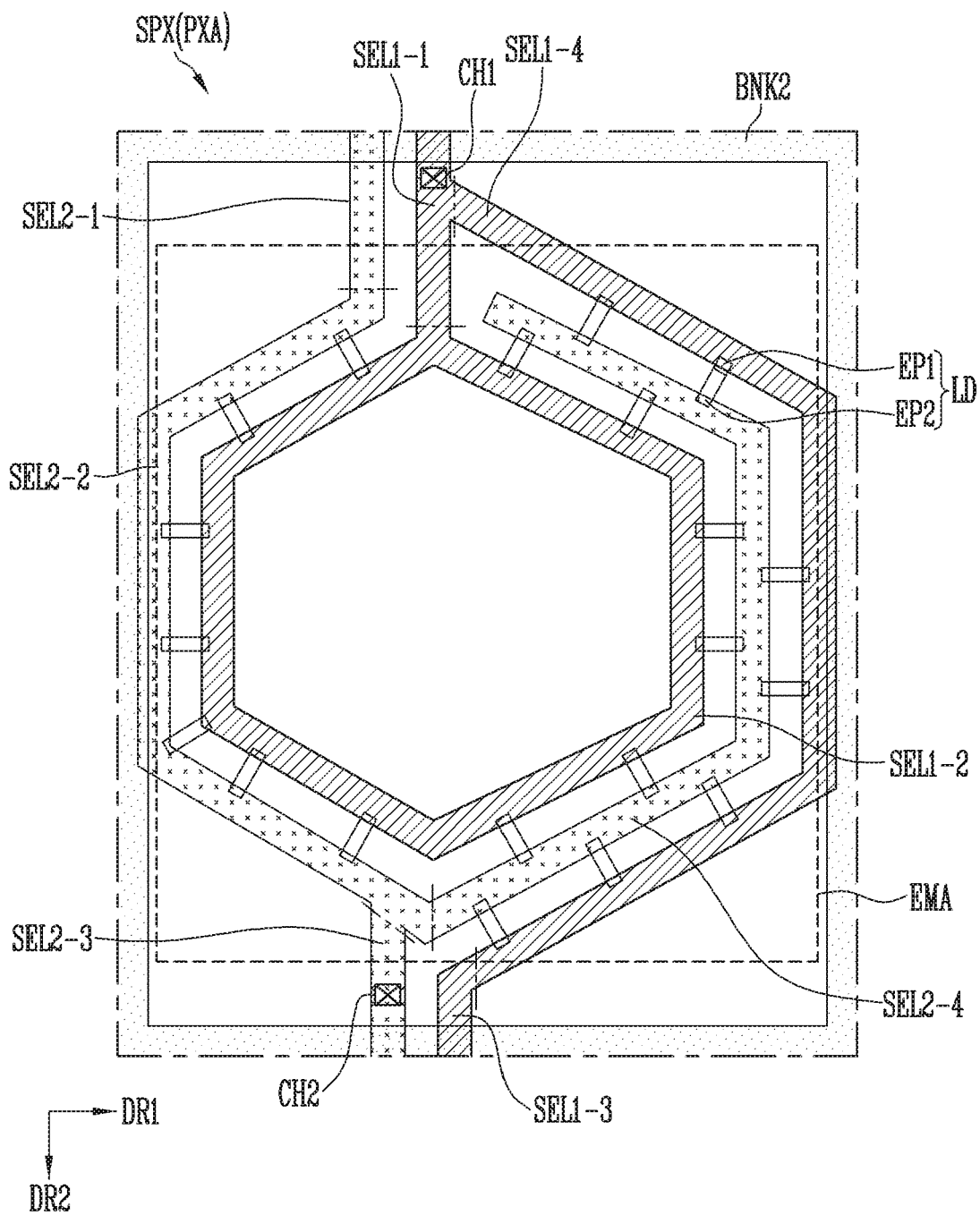
FIGS. 11 and 12 are diagrams schematically illustrating another example of the sub pixel included in the display device of FIG. 5.
Figure 12:
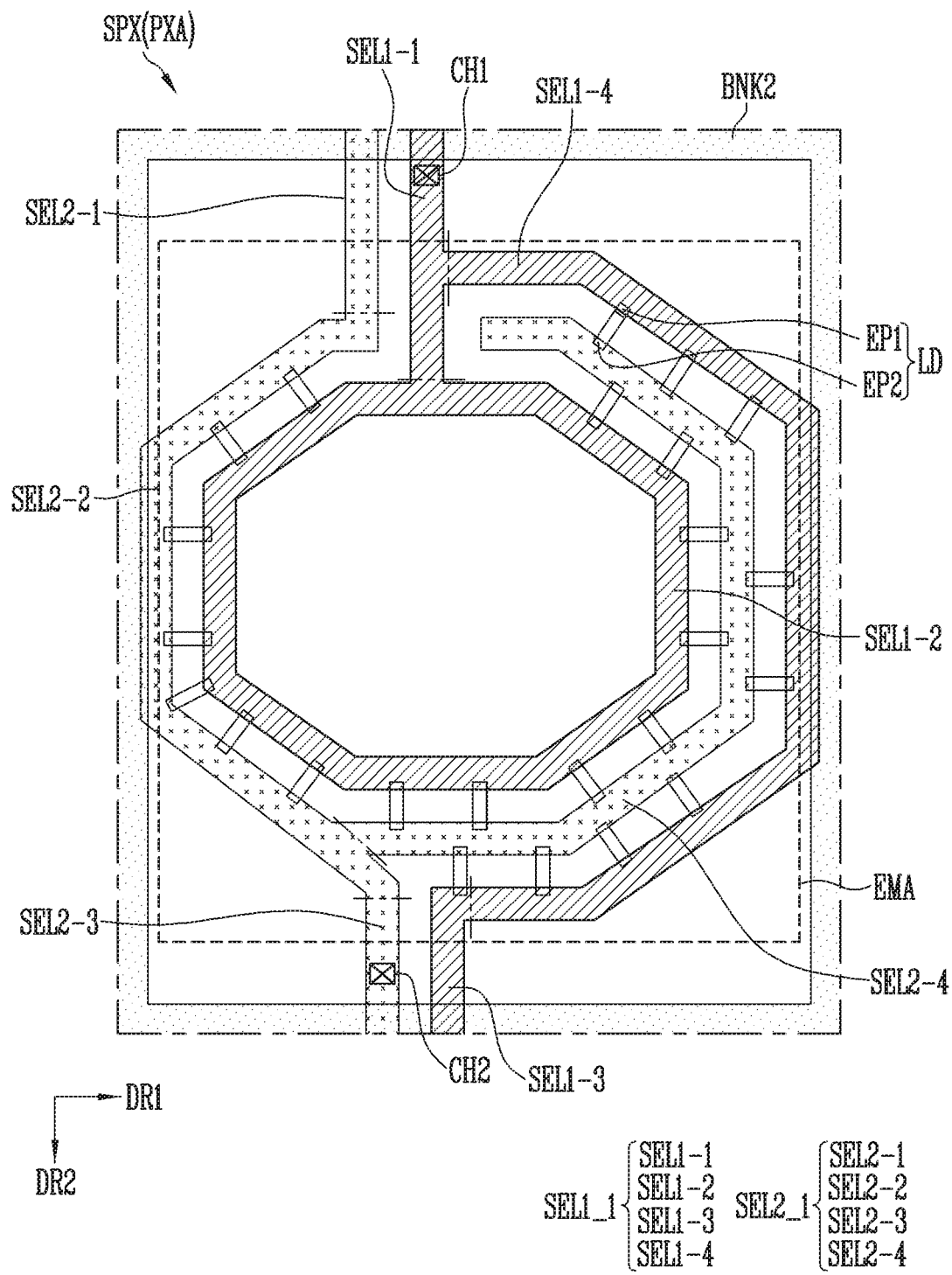

FIGS. 11 and 12 are diagrams schematically illustrating another example of the sub pixel included in the display device of FIG. 5.

Referring to FIGS. 11 and 12, there may be differences between the embodiment shown FIGS. 11 and 12 and the embodiment shown in FIGS. 8 to 10 in that the shape of the closed loop of the second section SEL1-2 may be a hexagonal shape having six vertices as shown in FIG. 11 and the shape of the closed loop of the second section SEL1-2 may be an octagonal shape having eight vertices as shown in FIG. 12.

Specifically, the first sub electrode SEL1 shown in FIGS. 11 and 12 may include the first section SEL1-1, the second section SEL1-2, the third section SEL1-3, and the fourth section SEL1-4.

The first section SEL1-1 may be extended in the second direction DR2. An end of the first section SEL1-1 may be electrically and/or physically connected to a portion of the second terminal DE of the first transistors T1 and T through the first contact hole CH1. Another end of the first section SEL1-1 may be connected to the second section SEL1-2.

The second section SEL1-2 may be the closed loop of the polygonal shape described above with reference to FIG. 7. According to an embodiment, the closed loop may have the hexagonal shape having six vertices or the octagonal shape having eight vertices. However, the shape of the closed loop is not limited thereto. For example, the second section SEL1-2 of the first sub electrode SEL1 may be a structure in which an internal cavity of the closed loop may be filled rather than a closed loop structure.

The third section SEL1-3 may be a portion of the first electrode EL1 extending discontinuously from the first section SEL1-1. For example, the third section SEL1-3 may be disposed to be spaced apart from the first section SEL1-1 and extend in the second direction DR2. The end of the third section SEL1-3 may be connected to the fourth section SEL1-4.

The fourth section SEL1-4 may be disposed to be spaced apart from the second section SEL 1-2 by an interval along a closed loop shape of the second section SEL1-2. The fourth section SEL1-4 may have a shape surrounding the closed loop of the hexagonal shape or the octagonal shape described above. An end of the fourth section SEL1-4 may be connected to a region of the first section SEL1-1, and another end of the fourth section SEL1-4 may be connected to the end of the third section SEL1-3.

The second sub electrode SEL2 may include the fifth section SEL2-1, the sixth section SEL2-2, the seventh section SEL2-3, and the eighth section SEL2-4.

The fifth section SEL2-1 may be disposed to be spaced apart from the first section SEL1-1 of the first sub electrode SEL1 by a distance in a plan view and may be extended in parallel to the first section SEL1-1 along the second direction DR2.

The sixth section SEL2-2 may be disposed to be spaced apart from the second section SEL1-2 of the first sub electrode SEL1 in a plan view by a distance, and may be extended parallel to the closed loop shape of the second section SEL1-2. The sixth section SEL2-2 may have a shape surrounding the closed loop of the hexagonal shape or the octagonal shape described above. An end of the sixth section SEL2-2 may be connected to the end of the fifth section SEL2-1, and another end of the sixth section SEL2-2 may be connected to the end of the seventh section SEL2-3.

The seventh section SEL2-3 may be continuously extending from the fifth section SEL2-1 via the sixth section SEL2-2. The seventh section SEL2-3 may be disposed to be spaced apart from the third section SEL1-3 of the first sub electrode SEL1 in a plan view by a distance, and may be extended in parallel to the fifth section SEL2-1 along the second direction DR2.

The eighth section SEL2-4 may be disposed to be spaced apart from a region between the second section SEL1-2 and the fourth section SEL1-4 of the first sub electrode SEL1 by an interval. The eighth section SEL2-4 may have a shape surrounding the closed loop of the hexagonal shape or the octagonal shape described above. An end of the eighth section SEL2-4 may be connected to the end of the sixth section SEL2-2, and another end of the eighth section SEL2-4 may not be connected to any section of the first to seventh sections SEL1-1 to SEL1-4 and SEL2-1 to SEL2-3.

In the light emission area EMA, the light emitting elements LD may be aligned along the periphery of the second section SEL1-2 of the first sub electrode SEL1. According to an embodiment, the light emitting elements LD may be aligned radially about the second section SEL1-2 of the hexagonal shape or the octagonal shape between the second section SEL1-2 of the first sub electrode SEL1 and the sixth section SEL2-2 and the eight section SEL2-4 of the second sub electrode SEL2, and between the fourth section SEL1-4 of the first sub electrode SEL1 and the eighth section SEL2-4 of the second sub electrode SEL2.

A cross-sectional structure of the sub pixel region PXA may be the same as that shown in FIGS. 9 and 10, and thus repetitive description is omitted.

Figure 13:
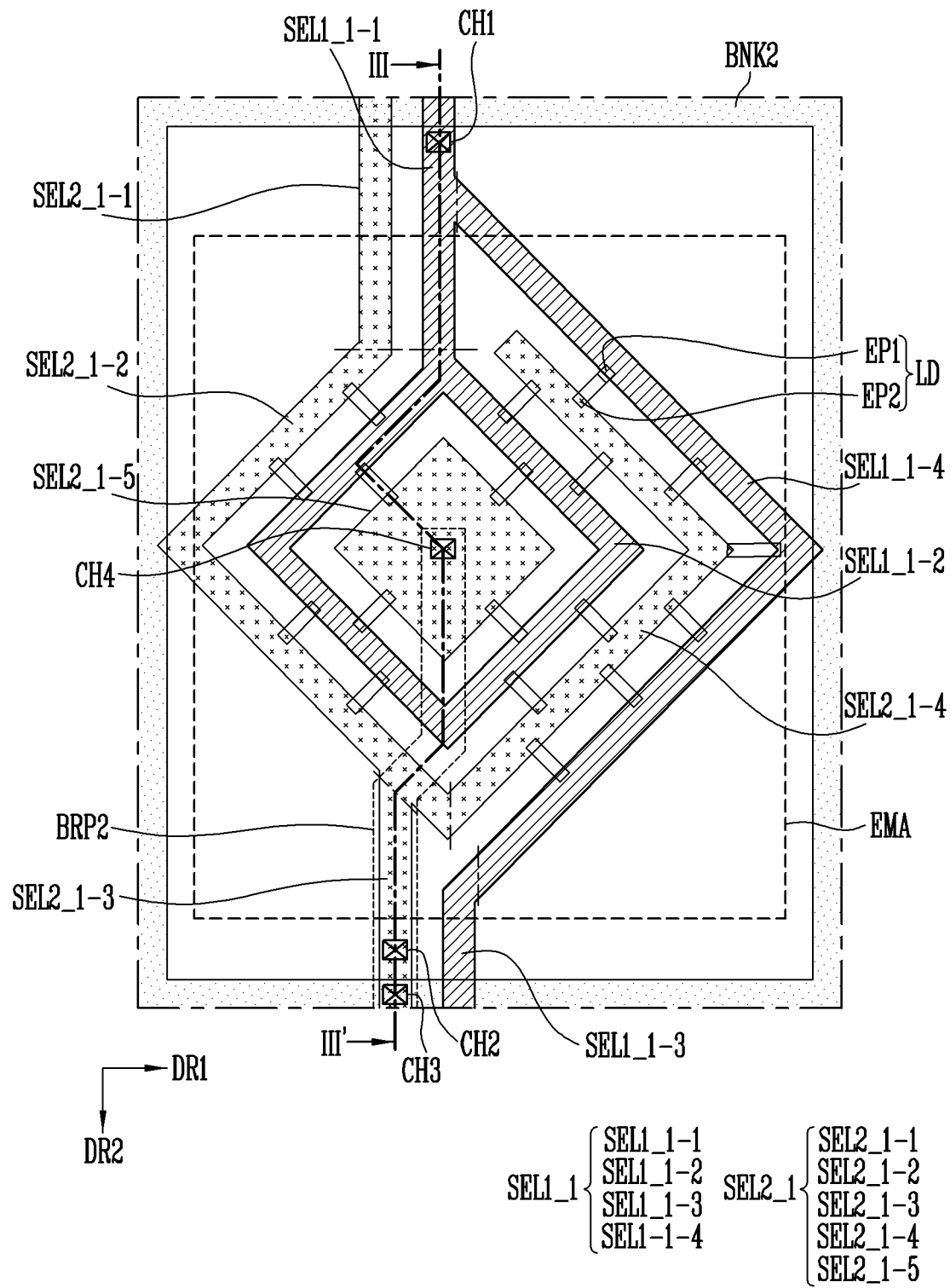
FIG. 13 is a diagram schematically illustrating still another example of the sub pixel included in the display device of FIG. 5.
Figure 14:
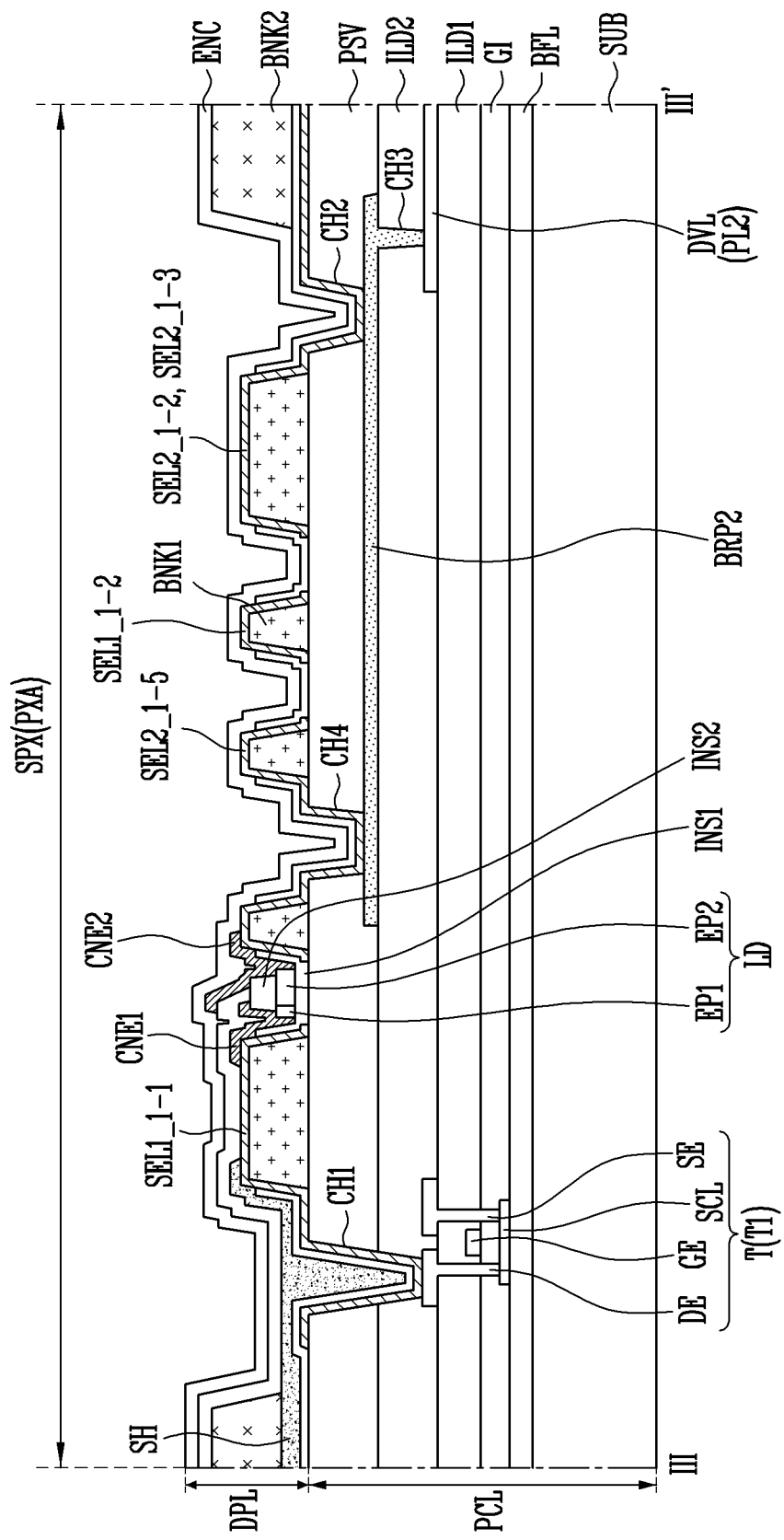
FIG. 14 is a schematic cross-sectional view taken along line III-III' of FIG. 13.

FIG. 13 is a diagram schematically illustrating still another example of the sub pixel included in the display device of FIG. 5. FIG. 14 is a schematic cross-sectional view taken along line III-III' of FIG. 13.

Referring to FIGS. 13 and 14, there may be a difference between the embodiment shown FIGS. 13 and 14 and the embodiment shown in FIGS. 8 to 10 in that a ninth section SEL2_1-5 and a second bridge pattern of the second sub electrode SEL2_1 may be included in a cavity in the closed loop of a second section SEL1_1-2 of the first sub electrode SEL1_1 as shown in FIG. 13.

Specifically, the first sub electrode SEL1_1 shown in FIGS. 13 and 14 may include a first section SEL1_1-1, a second section SEL1_1-2, a third section SEL1_1-3, and a fourth section SEL1_1-4.

The first section SEL1_1-1 may be extended in the second direction DR2. An end of the first section SEL1_1-1 may be electrically and/or physically connected to a portion of the second terminal DE of the first transistors T1 and T through the first contact hole CH1. Another end of the first section SEL1_1-1 may be connected to the second section SEL1_1-2.

The second section SEL1_1-2 may be the closed loop of the polygonal shape described above with reference to FIG. 7. According to an embodiment, the closed loop may have a rhombus shape having four bend points. However, the shape of the closed loop is not limited thereto. For example, the second section SEL1_1-2 of the first sub electrode SEL1_1 may be a structure in which an internal cavity of the closed loop may be filled rather than a closed loop structure.

The third section SEL1_1-3 may be a portion of the first electrode EL1 extending discontinuously from the first section SEL1_1-1. For example, the third section SEL1_1-3 may be disposed to be spaced apart from the first section SEL1_1-1 and extend in the second direction DR2. An end of the third section SEL1_1-3 may be connected to the fourth section SEL1_1-4.

The fourth section SEL1_1-4 may be disposed to be spaced apart from each other by an interval along a closed loop shape of the second section SEL1_1-2. The fourth section SEL1_1-4 may have a V shape along the closed loop of the rhombus shape described above. An end of the fourth section SEL1_1-4 may be connected to a region of the first section SEL1_1-1, and another end of the fourth section SEL1_1-4 may be connected to the end of the third section SEL1_1-3.

The second sub electrode SEL2_1 may include a fifth section SEL2_1-1, a sixth section SEL2_1-2, a seventh section SEL2_1-3, and an eighth section SEL2_1-4.

The fifth section SEL2_1-1 may be disposed to be spaced apart from the first section SEL1_1-1 of the first sub electrode SEL1_1 by a distance in a plan view and may be extended in parallel to the first section SEL1_1-1 along the second direction DR2.

The sixth section SEL2_1-2 may be disposed to be spaced apart from the second section SEL1_1-2 of the first sub electrode SEL1_1 in a plan view by a distance and may be extended in parallel to the closed loop shape of the second section SEL1_1-2. The sixth section SEL2_1-2 may have a V shape along the closed loop of the rhombus shape. An end of the sixth section SEL2_1-2 may be connected to an end of the fifth section SEL2_1-1, and another end of the sixth section SEL2_1-2 may be connected to an end of the seventh section SEL2_1-3.

The seventh section SEL2_1-3 may be continuously connected via the fifth section SEL2 1-1 and the sixth section SEL2_1-2. The seventh section SEL2_1-3 may be disposed to be spaced apart from the third section SEL1_1-3 of the first sub electrode SEL1_1 in a plan view by a distance and may be extended in parallel to the fifth section SEL2_1-1 along the second direction DR2.

The eighth section SEL2_1-4 may be disposed to be spaced apart from each of the second section SEL1_1-2 and the fourth section SEL1_1-4 of the first sub electrode SEL1_1 by an interval. The eighth section SEL2_1-4 may have a V shape along the closed loop of the rhombus shape described above. An end of the eighth section SEL2_1-4 may be connected to an end of the sixth section SEL2_1-2, and another end of the eighth section SEL2_1-4 may not be connected to any section of the first to seventh sections SEL1_1-1 to SEL1_1-4 and SEL2_1-1 to SEL2_1-3.

The ninth section SEL2_1-5 may be disposed in the internal cavity of the second section SEL1_1-2 of the first sub electrode SEL1_1. The ninth section SEL2_1-5 may be spaced apart from the second section SEL1_1-2 by an interval. The ninth section SEL2_1-5 may have the same shape as the closed loop shape of the second section SEL1_1-2. The ninth section SEL2_1-5 may be an island shape that may be not connected to all of the fifth to eighth sections SEL2_1-1 to SEL2_1-4.

Hereinafter, the cross-sectional structure of the sub pixel region PXA will be described.

The pixel circuit portion PCL may include a second bridge pattern BRP2 on the second interlayer insulation film ILD2.

The second bridge pattern BRP2 may be disposed in the sub pixel region PXA and may be extended generally along the second direction DR2. However, a shape of the second bridge pattern BRP2 is not limited to the above-described embodiment. The second bridge pattern BRP2 may be extended from the light emission area EMA to the peripheral area positioned around the light emission area EMA.

The second bridge pattern BRP2 may be electrically connected to the second sub electrode SEL2 included in the display element portion DPL through the second contact hole CH2 passing through the protective film PSV. The second bridge pattern BRP2 may be electrically connected to the driving voltage lines DVL and PL2 through the third contact hole CH3 passing through the second interlayer insulation film ILD2. As the second bridge pattern BRP2 may be electrically connected to the driving voltage lines DVL and PL2, the second driving voltage VSS applied to the driving voltage lines DVL and PL2 may be transferred to the second bridge pattern BRP2.

The second bridge pattern BRP2 may be electrically connected to the ninth section SEL2_1-5 of the second sub electrode SEL2_1 included in the display element portion DPL through a fourth contact hole CH4 passing through the protective film PSV. Therefore, the driving current may also flow through the ninth section SEL2_1-5 of the island shape that may not be connected to all of the fifth to eighth sections SEL2_1-1 to SEL2_1-4.

It will be understood by those skilled in the art that the invention may be carried out in other specific forms without changing the technical spirit or essential characteristics thereof. Therefore, it should be understood that the above-described embodiments are illustrative in all aspects and not restrictive. The scope of the invention is defined by the following claims rather than the above detailed description, and it is intended that all changes and modifications drawn from the meaning and range of the claims and the equivalents thereof are included within the scope of the invention.

What is claimed is:

1. A display device comprising:
  a substrate including a display area and a non-display area; and
  pixels disposed in the display area, the pixels each including:
    first electrodes;
    second electrodes spaced apart from the first electrodes; and
    light emitting elements disposed between the first electrodes and the second electrodes,
    wherein the first electrodes each include a closed loop of a polygonal shape in some sections.

2. The display device according to claim 1, wherein the closed loop of the polygonal shape is any of a rhombus, a hexagon, and an octagon.

3. The display device according to claim 1, wherein the first electrodes each include:
  a first section;
  a second section connected to an end of the first section and having the closed loop of the polygonal shape;
  a third section discontinuously extending from the first section; and
  a fourth section having an end connected to a region of the first section and another end connected to an end of the third section.

4. The display device according to claim 3, wherein the second electrodes each include:
  a fifth section;
  a sixth section connected to an end of the fifth section and extending along an outer shape of the second section;
  a seventh section continuously extending from the fifth section via the sixth section; and
  an eighth section spaced apart from each of the second section and the fourth section.

5. The display device according to claim 4, wherein the light emitting elements are disposed between the second section and the sixth section, between the second section and the eighth section, and between the fourth section and the eighth section.

6. The display device according to claim 5, wherein the light emitting elements are disposed radially with respect to the second section.

7. The display device according to claim 4, wherein the second electrodes each include a ninth section spaced apart from the second section, the ninth section having an island shape disposed inside the closed loop of the second section.

8. The display device according to claim 7, wherein the light emitting elements are disposed radially with respect to the second section between the second section and the ninth section.

9. The display device according to claim 1, wherein the light emitting elements each include:
  a first semiconductor layer;
  a second semiconductor layer; and
  an active layer disposed between the first semiconductor layer and the second semiconductor layer, wherein
    the first semiconductor layer includes an n-type semiconductor layer, and the second semiconductor layer includes a p-type semiconductor layer.

10. The display device according to claim 1, wherein the pixels are arranged in a pentile structure.

11. A display device comprising:
a substrate;
a pixel circuit portion disposed on the substrate; and
a display element portion disposed on the pixel circuit portion,
wherein the display element portion includes a pixel, the pixel comprising:
first electrodes;
second electrodes spaced apart from the first electrodes; and
light emitting elements disposed between the first electrodes and the second electrodes,
wherein the first electrodes each include a closed loop of a polygonal shape in some sections.

12. The display device according to claim 11, wherein the pixel circuit portion includes a driving transistor, a switching transistor, a capacitor, and a driving voltage line.

13. The display device according to claim 12, wherein the first electrodes each include:
a first section;
a second section connected to an end of the first section and having the closed loop of the polygonal shape;
a third section discontinuously extending from the first section; and
a fourth section having an end connected to a region of the first section and another end connected to an end of the third section.

14. The display device according to claim 13, wherein the second electrodes each include:
a fifth section;
a sixth section connected to an end of the fifth section and extending along an outer shape of the second section;
a seventh section continuously extending from the fifth section via the sixth section; and
an eighth section spaced apart from each of the second section and the fourth section.

15. The display device according to claim 14, wherein the light emitting elements are disposed between the second section and the sixth section, between the second section and the eighth section, and between the fourth section and the eighth section.

16. The display device according to claim 15, wherein the light emitting elements are disposed radially with respect to the second section of the polygonal shape.

17. The display device according to claim 14, wherein
the pixel circuit portion includes a first bridge pattern,
the end of the first section is connected to an electrode of the driving transistor through a first contact hole,
the seventh section is connected to the first bridge pattern through a second contact hole, and
the first bridge pattern is connected to the driving voltage line through a third contact hole.

18. The display device according to claim 14, wherein the second electrodes further include a ninth section spaced apart from the second section, the ninth section having an island shape disposed inside the closed loop of the polygonal shape formed in the second section.

19. The display device according to claim 18, wherein the light emitting elements are disposed radially with respect to the second section of the polygonal shape between the second section and the ninth section.

20. The display device according to claim 18, wherein
the pixel circuit portion includes a second bridge pattern,
the seventh section is connected to a second bridge pattern through the second contact hole,
the second bridge pattern is connected to the driving voltage line through a third contact hole, and
the ninth section is connected to the second bridge pattern through a fourth contact hole.

* * * * *